United States Patent [19]

Snellen

[11] Patent Number: 5,430,831
[45] Date of Patent: Jul. 4, 1995

[54] METHOD OF PACKING RECTANGULAR OBJECTS IN A RECTANGULAR AREA OR SPACE BY DETERMINATION OF FREE SUBAREAS OR SUBSPACES

[75] Inventor: Theodorus C. C. M. Snellen, The Hague, Netherlands

[73] Assignee: Koninklijke PTT Nederland N.V., Groningen, Netherlands

[21] Appl. No.: 33,959

[22] Filed: Mar. 19, 1993

Related U.S. Application Data

[63] Continuation-in-part of Ser. No. 823,705, Jan. 21, 1992, abandoned.

[30] Foreign Application Priority Data

Mar. 19, 1991 [NL] Netherlands ............... 9100483

[51] Int. Cl.⁶ .............................................. G06T 11/60
[52] U.S. Cl. ..................................... 395/133; 395/123; 395/135; 395/148; 395/921; 395/919; 364/148
[58] Field of Search ................ 395/123, 124, 127, 128, 395/133, 134, 135, 141, 145, 148, 155, 161, 500, 919, 920, 921; 364/148, DIG. 1, DIG. 2

[56] References Cited

U.S. PATENT DOCUMENTS

| | | | |
|---|---|---|---|
| 3,705,410 | 12/1972 | Kooy et al. | 444/1 |
| 4,554,625 | 11/1985 | Otten | 395/921 X |
| 4,611,268 | 9/1986 | Gotz et al. | 364/148 |
| 5,159,682 | 10/1992 | Toyonaga et al. | 364/DIG. 2 X |
| 5,317,680 | 5/1994 | Ditter, Jr. | 395/135 |

FOREIGN PATENT DOCUMENTS 0389985 10/1990 European Pat. Off. ...... G06F 15/24

OTHER PUBLICATIONS

European Journal of Operational Research, vol. 44, 1990, Amsterdam, NL pp. 277–288, H. Gehrin et al.: "A computer-based heuristic for packing pooled shipment containers".

The Journal of the Apparel Research Foundation, Inc., vol. 2, No. 2, 1967 New York, pp. 1–23, R. C. Art, Jr.: "Computerized Marker Making: An Approach to the Pattern Layout Problem in the Garment Industry".

Mesucora, vol. 2, 1963, Paris, France, pp. 128–133, M. Lermoyez: 'Problems d'Optimalisation de Decoupe'.

Author Not Listed, "Automated parcel handling with an industrial robot", 1986, pp. 183–187, Industrial Mechanical Engineers, Dr. Neher Laboratories, Leidschendam, The Netherlands.

Frank Dehne, "Computing the Largest Empty Rectangle on One- and Two Dimensional Processor Arrays", May 9, 1990, 63–68.

O. Gurel, "Optimization of Irregular Pattern Layouts", IBM Technial Disclosure Bulletin, vol. II, No. 5, Oct. 1968, 535–539.

S. A. Segenreich and L. M. P. F. Braga, "Optimal Nesting of General Plane Figures. . . " Computer and Graphics, vol. 10, pp. 229–237 (1986).

*Primary Examiner*—Almis R. Jankus
*Attorney, Agent, or Firm*—Frishauf, Holtz, Goodman & Woodward

[57] ABSTRACT

A method of optimally packing, either intermittently or continuously, a storage or transportation area or space with rectangular parallelepiped objects, e.g. parcels, comprises two main steps of complex calculations. A first main step implies the locating of one or more free subareas or free subspaces on the area or in the space available for packing by means of a matrix reduction procedure for a 2- or 3-dimensional matrix representing free and occupied parts of rectangular or rectangular parallelepiped form. In a second main step a score is established for each different combination of a free subarea or subspace and an object to be packed and a possible orientation of the object for fitting in the subarea or subspace. The score is established by assigning a score value to each combination by passing through a hierarchy of determinations, whereby a score is the more favorable if the score value is assigned at a higher level in the hierarchy. Thereafter a combination of free area (or free space) and object and orientation having a most favorable score among the established scores is selected and the object of that combination is placed on the free area (or in the free space) and in the orientation for which the most favorable score was established. After placing the object with the most favorable score the first and second main steps are repeated for the possibly remaining free area or free space and objects to be packed.

18 Claims, 7 Drawing Sheets

[1] (0,y4)-(xm,y5)

[2] (x1,0)-(x5,y2)

[3] (0,y4)-(x5,y6)

[4] (x3,y3)-(xm,y5)

[5] (0,y4)-(x4,y7)

[6] (x6,y3)-(xm,y7)

[7] (x2,y4)-(x4,ym)

[8] (x6,y3)-(x8,y8)

[9] (x3,0)-(x5,y6)

[10] (x7,y1)-(xm,y7)

[11] (x7,y1)-(x8,y8)

[12] (x3,0)-(x4,ym)

{1} (0,y3,0)-(xm,ym,zm)

{2} (x2,y1,0)-(xm,ym,zm)

{3} (x2,0,z1)-(xm,ym,zm)

{4} (x1,0,z2)-(xm,ym,zm)

{5} (0,y2,z2)-(xm,ym,zm)

{6} (0,0,z3)-(xm,ym,zm)

METHOD OF PACKING RECTANGULAR OBJECTS IN A RECTANGULAR AREA OR SPACE BY DETERMINATION OF FREE SUBAREAS OR SUBSPACES

This application is a continuation-in-part, of application Ser. No. 07/823,705, filed Jan. 21, 1992, now abandoned.

BACKGROUND OF THE INVENTION

1. Field of the Invention

The invention relates to methods of loading or storing rectangular objects in rectangular areas or spaces of transportation or storage containers.

2. Background and Prior Art

The determination of the most favorable area division in cutting essentially rectangular objects out of a sheet or plate of material, such as leather or metal, and also the positioning of objects in a space, such as the positioning of postal packages in a container used by the post office, and the positioning of containers having different dimensions in a cargo space of, for example, a ship has hitherto been done mainly by hand, with a member of staff attempting to achieve an optimum material utilisation or packing density on the basis of his experience. It will be clear that it is desirable to at least partially automate this cutting or packing, in particular if it is to be accompanied by a reduction in the material loss or an increase in the packing density, respectively, that is to say a more optimum use of the available material or the available space.

A problem in this connection is that the calculation of the free subareas on an area partially filled with objects or free spaces in a space partially filled with objects is very complex, in particular if the objects already positioned have different dimensions.

The same problem zpplies to the calculation of an optimal selection of a next object from a number of objects to be placed with given dimensions for placing it in one of the calculated free subareas or subspaces in order to reach optimal use of the momentaneously available free area or space. For example for the three-dimensional case it is known that an automated parcel handling as known from S.P. Lie, "Automated parcel handling with an industrial robot", Proceedings of the Institution of Mechanical Engineers, 13–14 May 1986, Birdcage Walk, London, pp. 183–187) needs a loading algorithm with the task to determine which one of a number of buffered parcels must be handled next, and how this parcel can be placed in a container in the best possible way in order to achieve efficient loading of the container. This known algorithm uses a datastructure representing the space already occupied int he container by parcels, which datastructure is ot described in further details. Likewise it is not described how a next parcel is selected and placed in the free space for achieving optimal use thereof. H. Gehring et al., "A computer-based heuristic for packing pooled shipment containers", European Journal of Operational Research 44(1990), pp. 227–288, disclose a method for the generation of stowage plants for the packing of boxes entered in a list with decreasing volume in a container. The packing occures in vertical layers. The first box to be filled in the layer is defined as a layer determining box, whereas the spare spaces of the layer are filled each time with the best fitting pairs of boxes remaining in the list, i.e. the pair with the highest volume which can be fitted in the apare space. Alternative stowage plans are produced by different positions of the layer determining box or by moving the second, third, etc. element of the box-list to the beginning of the list before starting the method for generation. From the different stowage plans a stowage overseer can choose a suitable plan. This known method has some drawbacks, e.g. that only within each layer a certain optimisation of the packing density can be reached and that is needs human intervention for selecting a suitable one from the different generated stowage plans. In addition, the calculations are always to be carried out again after positioning a new object.

SUMMARY OF THE INVENTION

The object of the invention is to simplify the complex calculation problem which guides the disposition of rectangular objects and to simplify that problem to such an extent that a method of optimally packing, either intermittently or continuously, a storage or transportation space is made possible with an acceptable calculation time. This is important because after positioning a new object it is ecessary to provide another calculation of the free subareas or subspaces remaining, so that in the method of the invention there are repeated economies.

Briefly, in a first embodiment the area or space to be occupied by objects is first depicted in the form of a matrix. The matrix is two-dimensional in the case of an area to be occupied and three-eimensional in the case of space to be occupied by rectangular objects.

In the matrix each element represents a rectangle of the area or rectangular space and it is established for each element whethe rthe rectangular area or space is free or occupied by assigning a binary logic value. A first equation group identifies a free subarea or subspace. Matrix reduction is then carried out by always reducing by 1 the number of rows or the the number of columns (and in case of a three-dimensional matrix also the number of layers) int he matrix in apredetrmined sequence in consecutive steps until a (1,1) or a (1,1,1) or a null matrix is left, the possible free subareas always being determined by means of a first equation group after every matrix reduction step. Second equation groups, and so on, are provided for matrix reductions in the other dimensions and a final equation group determines the logic value of an element in the reduced matrix. The dimensions of the free subareas or subspaces is determined using the first equation group by updating a dimension table for all dimensions of the matrix and by adjusting the dimension table for rows or for the columns (or for the layers) in a corresponding step during matrix reduction. The free subareas or subspaces are located by matrix reduction to the null matrix in each dimension, after which the objects fitting into the located free subareas or subspaces are placed therein.

A second embodiment of the method of the invention which does not rely on reduction of a logic matrix (which can be automated, but is not understood by many individuals) first measures the dimensions of the rectangle sides or faces in the respective objects to be placed in an area or or in a space and then establihses a score for each of a plurality of free subareas or free subspaces (located before), for each of the objects for each of serveral possible orientations (two in case of an area, six in the case of a space). The scores are established by assigning score values by passing through a hierarchy of determinations, whereby a score is the more favorable if the score value is assigned at a higher level in the hierarchy. Thereafter a combination of free area (or free space) and object and orientation having a most favorable score among the establihsed scores is selected and the object of that combination is placed on the free area (or in the free space) and in the orientation for which the most favorable score was established.

In a third embodiment which is a preferred embodiment of the second embodiment of the method according to the invention, a mathematical formula is used going beyond mere addition and subtraction, but less complicated than matrix reduction, and the score values are arranged in that the most favorable score is the score corresponding with the smallest score value assigned. In this embodiment of the method the step of determining whether all dimensions of an object are smaller than the corresponding dimensions of a rectangular area or space leads to a score value determination in accordance with the formula $[(X_s-X_P)/X_s]^{k*}[(Y_s-Y_p)/Y_s]^l$ with the exponents each not less than 1 for the two-eimensinal case and the formula $[(X_s-X_p)/X_s]^{k*}[(Y_s-Y_p)/Y_s]^{l*}[(Z_s-Z_p)/Z_s]^m$ with each of the exponents not less than 1 for the three-dimensional case.

In a method of the invention placing rectangular objects in a rectangular space that may be partially filled with rectangular objects, it is important to determine whether an object that might be selected would be sufficiently supported in a free space that has been located. For that purpose four areas are defined for the object on its bottom face (for every permissible orientation). Those areas may not overlap each other and each should comprise a corner point of the object. Then, since the object is supported at least at one point in each area, that is sufficient support. Furthermore, if in the placement of an object in a free space the object would come to rest with a lateral face against an adjacent object, that would be a substitute for support in any of the four areas which is adjacent to that lateral face.

The composite symbol ":=" is a recommended mathematical symbol with the meaning 'by definition equal to' (see e.g. "Symbols, units nomenclature and fundamental constants in physics", Document I.U.P.A.P.-25 (SUNAMCO 87-1), 1987 revision, cpt 5 "Recommended Mathematicl Symbols" p. 47.

As will be explained in greater detail below, the measures according to the invention make it possible to determine in all cases the remaining free areas or spaces accurately in the case, which occurs very often in practice, of positioning essentially rectangular objects on an essentially rectangular area or of positioning objects having an essentially right parallelepiped shape in a space having an essentially right parallelepiped shape, and, on the basis of the dimensions of the objects still to be positioned on the area or in the space, which dimensions are stored, for example, in a memory, to automatically select the object whose dimensions approximate most closely those of the free areas or spaces found. On the basis of the available data of the objects to be positioned, it is also possible to select a cargo space or container having optimum dimensions.

BRIEF DESCRIPTION OF THE DRAWINGS

The invention will be explained below by reference to an exemplary embodiment for the placement of mainly rectangular parcels in a mainly rectangular space, although it is emphatically stated that the principle according to the invention is directly applicable to optimising the placement of objects on an area with particular dimensions, if instead of three dimensions only two dimensions are considered. However for the sake of simplicity and clarity the calculation for the determining of the free subspaces is illustrated for the two-dimensional case.

In the drawing:

FIG. 1b: shows schematically a matrix representation of the situation shown in FIG. 1a;

FIG. 3b shows schematically a three-dimensional matrix representation of the situation shown in FIG. 3a;

DESCRIPTION OF THE PREFERRED METHODS

Figure 1A:
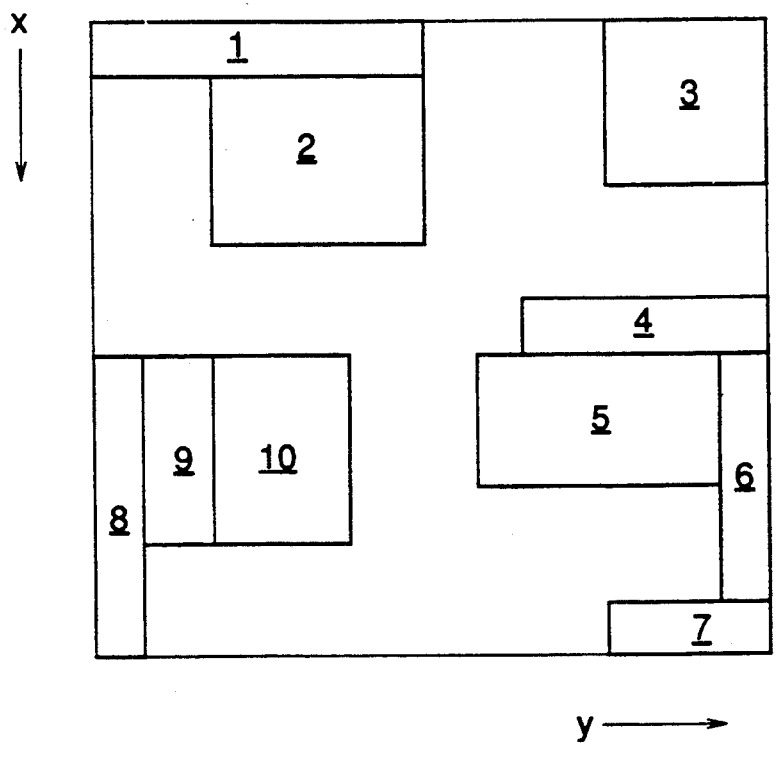
FIG. 1a: shows schematically an area filled with ten packages.
Figure 1B:
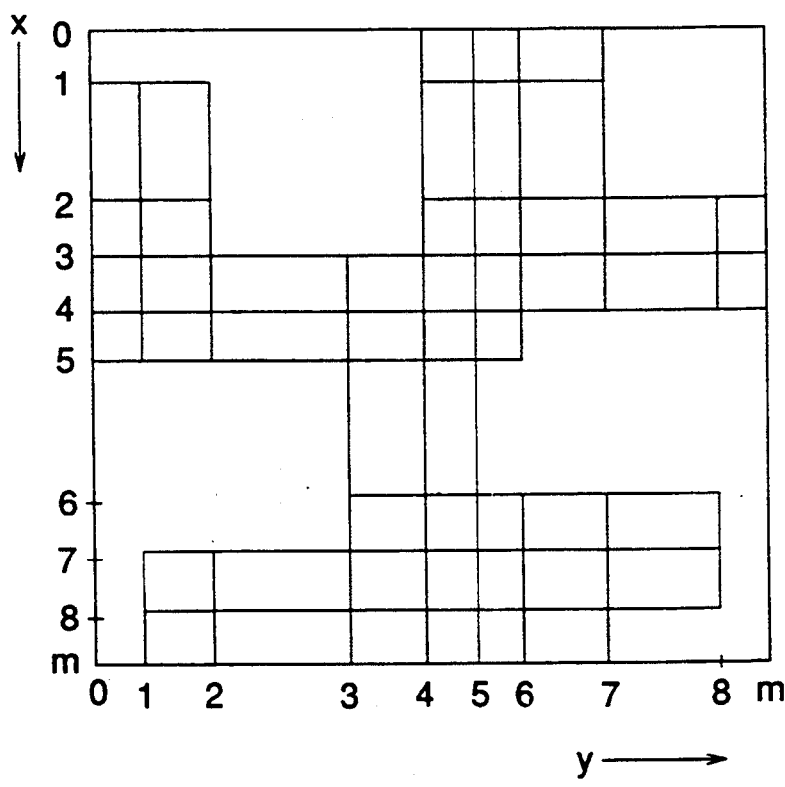

FIG. 1a shows a rectangular area with ten rectangular objects 1 to 10 inclusive lying on it which, together with the boundary of the area, determine the free subareas. FIG. 1b illustrates the conversion of the situation shown in FIG. 1a to a matrix representation, which representation can be reproduced as follows if A=0 is assumed for the first logic value and B=1 is assumed for the second logic value:

| x = | y = | 1 | 2 | 3 | 4 | 5 | 6 | 7 | 8 | 9 |
|---|---|---|---|---|---|---|---|---|---|---|
| 1 | | 0 | 0 | 0 | 0 | 1 | 1 | 1 | 1 | 0 |
| 2 | | 1 | 1 | 0 | 0 | 1 | 1 | 1 | 0 | 0 |
| 3 | | 1 | 1 | 0 | 0 | 1 | 1 | 1 | 1 | 1 |
| 4 | | 1 | 1 | 1 | 1 | 1 | 1 | 1 | 1 | 1 |
| 5 | | 1 | 1 | 1 | 1 | 1 | 1 | 0 | 0 | 0 |
| 6 | | 0 | 0 | 0 | 1 | 1 | 0 | 0 | 0 | 0 |
| 7 | | 0 | 0 | 0 | 1 | 1 | 1 | 1 | 1 | 0 |
| 8 | | 0 | 1 | 1 | 1 | 1 | 1 | 1 | 1 | 0 |
| 9 | | 0 | 1 | 1 | 1 | 1 | 1 | 1 | 0 | 0 |

To determine the dimensions of the free spaces found, two tables are updated whose length corresponds to the number of rows and columns, respectively, of the matrix:

| x | y |
|---|---|
| 0–x1 | 0–y1 |
| x1–x2 | y1–y2 |
| x2–x3 | y2–y3 |
| x3–x4 | y3–y4 |
| x4–x5 | y4–y5 |
| x5–x6 | y5–y6 |

-continued

| x | y |
|---|---|
| x6–x7 | y6–y7 |
| x7–x8 | y7–y8 |
| X8–xm | y8–ym |

For the sake of completeness, it is pointed out that the illustrative example shown only shows an instantaneous picture during the process of positioning objects. Right at the beginning, the area is empty and the matrix is a (1,1) matrix and the dimension tables each contain one dimension, 0 - xm and 0 - ym, respectively; whenever an object is positioned, the dimensions of the matrix increase by not more than two rows and two columns and the dimension tables each increase by not more than two dimensions, unless the object positioned is adjacent to an object already present, in which case as will also be explained in greater detail below, the increase in the size of the matrix and the length of the dimension tables is smaller.

In order to find the free spaces in the illustrative example shown, the matrix is examined for the 'ones' which are bounded on four sides by 'zeros'. There is therefore a free subarea if $(x_i, y_l) = 1$ and $(x_{l-1}, y_l) = 0$ and $(x_l, y_{l-1}) = 0$ and $(x_{l+1}, y_l) = 0$ and $(x_l, y_{l+1}) = 0$ (I) for any element $x_l$, $y_l$ of the matrix.

Starting from the original matrix, the free areas having the smallest dimensions are found in this way. Searching for larger free subareas in this way would, however, quickly become fairly complex in this case and, in addition, would always require a function other than that according to (I) for each possible dimension of a free subarea. According to the invention, this problem is solved by reducing the matrix in rows and in columns, as will be explained further below, free subareas being found after reducing once in the x-direction using (I) with x=2 and y=1 as dimension, free subareas being found after reducing twice in the x-direction using (I) with x=3 and y=1 as dimension, free subareas being found after reducing once in the y-direction using (I) with x=1 and y=2 as dimension, etc. In determining the free subareas in this way, there is the possibility that free subareas partly overlapping one another are found, but this is not a drawback if, every time the free subareas have been calculated and a package has been positioned on the basis thereof, all the free subareas then available are again recalculated using (I) and using the consecutive steps of the complete matrix reduction.

The matrix, which is a representation of the packages positioned according to FIG. 1a, is reduced in accordance with the 'tree' below.

---

(9,9)—(8,9)—(7,9)—(6,9)—(5,9)—(4,9)—(3,9)—(2,9)—(1,9)

(9,8)—(8,8)—(7,8)—(6,8)—(5,8)—(4,8)—(3,8)—(2,8)—(1,8)

(9,7)—(8,7)—(7,7)—(6,7)—(5,7)—(4,7)—(3,7)—(2,7)—(1,7)

(9,6)—(8,6)—(7,6)—(6,6)—(5,6)—(4,6)—(3,6)—(2,6)—(1,6)

(9,5)—(8,5)—(7,5)—(6,5)—(5,5)—(4,5)—(3,5)—(2,5)—(1,5)

(9,4)—(8,4)—(7,4)—(6,4)—(5,4)—(4,4)—(3,4)—(2,4)—(1,4)

(9,3)—(8,3)—(7,3)—(6,3)—(5,3)—(4,3)—(3,3)—(2,3)—(1,3)

(9,2)—(8,2)—(7,2)—(6,2)—(5,2)—(4,2)—(3,2)—(2,2)—(1,2)

(9,1)—(8,1)—(7,1)—(6,1)—(5,1)—(4,1)—(3,1)—(2,1)—(1,1)

The reduction is done for the row direction or x-direction according to the formula below:

If $(x,y) = 1$ and $(x+1, y) = 1$, then $(x,y) := 1$, otherwise $(x,y) := 0$.

The reduction in the column direction or y-direction is carried out in the same way with the necessary changes.

The various steps during the reduction of the matrix are consecutively numbered and each is subdivided into a): the reduction and b): the search for free subareas.

After each reduction step in the x- or y-direction, the appropriate dimension table is also adjusted by shifting the right-hand column of said table one position higher and deleting the last (lowermost) element in the left-hand column.

The process is started by searching for free subareas in the original matrix:

1b) searching for free subareas

In the original matrix, no 'ones' are bounded on all sides by 'zeros' and therefore there are no free subareas.

2a) The dimension of the matrix in the x-direction is reduced to an (8×9) matrix:

| x = | y = | 1 | 2 | 3 | 4 | 5 | 6 | 7 | 8 | 9 | x | y |
|---|---|---|---|---|---|---|---|---|---|---|---|---|
| 1 | | 0 | 0 | 0 | 0 | 1 | 1 | 1 | 0 | 0 | 0–x2 | 0–y1 |
| 2 | | 1 | 1 | 0 | 0 | 1 | 1 | 1 | 0 | 0 | x1–x3 | y1–y2 |
| 3 | | 1 | 1 | 0 | 0 | 1 | 1 | 1 | 1 | 1 | x2–x4 | y2–y3 |
| 4 | | 1 | 1 | 1 | 1 | 1 | 1 | 0 | 0 | 0 | x3–x5 | y3–y4 |
| 5 | | 0 | 0 | 0 | 1 | 1 | 0 | 0 | 0 | 0 | x4–x6 | y4–y5 |
| 6 | | 0 | 0 | 0 | 1 | 1 | 0 | 0 | 0 | 0 | x5–x7 | y5–y6 |
| 7 | | 0 | 0 | 0 | 1 | 1 | 1 | 1 | 1 | 0 | x6–x8 | y6–y7 |
| 8 | | 0 | 1 | 1 | 1 | 1 | 1 | 1 | 0 | 0 | x7–xm | y7–y8 |
| | | | | | | | | | | | | y8–ym |

2b) There are no free subareas.

3a) The dimension of the matrix is reduced in the x-direction to a (7×9) matrix:

| x = | y = | 1 | 2 | 3 | 4 | 5 | 6 | 7 | 8 | 9 | x | y |
|---|---|---|---|---|---|---|---|---|---|---|---|---|
| 1 | | 0 | 0 | 0 | 0 | 1 | 1 | 1 | 0 | 0 | 0–x3 | 0–y1 |
| 2 | | 1 | 1 | 0 | 0 | 1 | 1 | 1 | 0 | 0 | x1–x4 | y1–y2 |
| 3 | | 1 | 1 | 0 | 0 | 1 | 1 | 1 | 0 | 0 | x2–x5 | y2–.. |
| 4 | | 0 | 0 | 0 | 1 | 1 | 0 | 0 | 0 | 0 | x3–x6 | ..–.. |
| 5 | | 0 | 0 | 0 | 1 | 1 | 0 | 0 | 0 | 0 | x4–x7 | ..–y8 |
| 6 | | 0 | 0 | 0 | 1 | 1 | 0 | 0 | 0 | 0 | x5–x8 | y8–ym |
| 7 | | 0 | 0 | 0 | 1 | 1 | 1 | 1 | 0 | 0 | x6–xm | |

3b) There are no free subareas.

4a) The dimension of the matrix is reduced in the x-direction to a (6×9) matrix:

| x = | y = | 1 | 2 | 3 | 4 | 5 | 6 | 7 | 8 | 9 | x | y |
|---|---|---|---|---|---|---|---|---|---|---|---|---|
| 1 | | 0 | 0 | 0 | 0 | 1 | 1 | 1 | 0 | 0 | 0–x4 | 0–y1 |
| 2 | | 1 | 1 | 0 | 0 | 1 | 1 | 1 | 0 | 0 | x1–x5 | y1–y2 |
| 3 | | 0 | 0 | 0 | 0 | 1 | 0 | 0 | 0 | 0 | x2–x6 | y2–.. |
| 4 | | 0 | 0 | 0 | 1 | 1 | 0 | 0 | 0 | 0 | x3–x7 | ..–.. |
| 5 | | 0 | 0 | 0 | 1 | 1 | 0 | 0 | 0 | 0 | x4–x8 | ..–y8 |
| 6 | | 0 | 0 | 0 | 1 | 1 | 0 | 0 | 0 | 0 | x5–xm | y8–ym |

4b) There are no free subareas.

5a) The dimension of the matrix is reduced in the x-direction to a (5×9) matrix:

| x = y = | 1 | 2 | 3 | 4 | 5 | 6 | 7 | 8 | 9 | x | y |
|---|---|---|---|---|---|---|---|---|---|---|---|
| 1 | 0 | 0 | 0 | 0 | 1 | 1 | 1 | 0 | 0 | 0–x5 | 0–y1 |
| 2 | 0 | 0 | 0 | 0 | 1 | 0 | 0 | 0 | 0 | x1–x6 | y1–y2 |
| 3 | 0 | 0 | 0 | 0 | 1 | 0 | 0 | 0 | 0 | x2–x7 | y2–.. |
| 4 | 0 | 0 | 0 | 1 | 1 | 0 | 0 | 0 | 0 | x3–x8 | ..–y8 |
| 5 | 0 | 0 | 0 | 1 | 1 | 0 | 0 | 0 | 0 | x4–xm | y8–ym |

5b) There are no free subareas
6a) The dimension of the matrix is reduced in the x-direction to a (4×9) matrix:

| x = y = | 1 | 2 | 3 | 4 | 5 | 6 | 7 | 8 | 9 | x | y |
|---|---|---|---|---|---|---|---|---|---|---|---|
| 1 | 0 | 0 | 0 | 0 | 1 | 0 | 0 | 0 | 0 | 0–x6 | 0–y1 |
| 2 | 0 | 0 | 0 | 0 | 1 | 0 | 0 | 0 | 0 | x1–x7 | y1–y2 |
| 3 | 0 | 0 | 0 | 0 | 1 | 0 | 0 | 0 | 0 | x2–x8 | y2–.. |
| 4 | 0 | 0 | 0 | 1 | 1 | 0 | 0 | 0 | 0 | x3–xm | ..–y8 |
| | | | | | | | | | | | y8–ym |

6b) There are no free subareas.
7a) The dimension of the matrix is reduced in the x-direction to a (3×9) matrix:

| x = y = | 1 | 2 | 3 | 4 | 5 | 6 | 7 | 8 | 9 | x | y |
|---|---|---|---|---|---|---|---|---|---|---|---|
| 1 | 0 | 0 | 0 | 0 | 1 | 0 | 0 | 0 | 0 | 0–x7 | 0–y1 |
| 2 | 0 | 0 | 0 | 0 | 1 | 0 | 0 | 0 | 0 | x1–x8 | y1–.. |
| 3 | 0 | 0 | 0 | 0 | 1 | 0 | 0 | 0 | 0 | x2–xm | ..–y8 |
| | | | | | | | | | | | y8–ym |

7b) There are no free subareas.
8a) The dimension of the matrix is reduced in the x-direction to a (2×9) matrix:

| x = y = | 1 | 2 | 3 | 4 | 5 | 6 | 7 | 8 | 9 | x | y |
|---|---|---|---|---|---|---|---|---|---|---|---|
| 1 | 0 | 0 | 0 | 0 | 1 | 0 | 0 | 0 | 0 | 0–x8 | 0–.. |
| 2 | 0 | 0 | 0 | 0 | 1 | 0 | 0 | 0 | 0 | x1–xm | ..–ym |

8b) There are no free subareas.
9a) The dimension of the matrix is reduced in the x-direction to a (1×9) matrix:

| x = y = | 1 | 2 | 3 | 4 | 5 | 6 | 7 | 8 | 9 | x | y |
|---|---|---|---|---|---|---|---|---|---|---|---|
| 1 | 0 | 0 | 0 | 0 | 1 | 0 | 0 | 0 | 0 | 0–xm | 0–.. |
| | | | | | | | | | | | ..–ym |

9b) There is one free subarea: (0,y4)—(xm,Y5) [1]
10a) The dimension of the matrix is now reduced in the y-direction to a (9×8) matrix in accordance with the procedure given above:

| x = y = | 1 | 2 | 3 | 4 | 5 | 6 | 7 | 8 | x | y |
|---|---|---|---|---|---|---|---|---|---|---|
| 1 | 0 | 0 | 0 | 0 | 1 | 1 | 0 | 0 | 0–x1 | 0–y2 |
| 2 | 1 | 0 | 0 | 0 | 1 | 1 | 0 | 0 | x1–x2 | y1–y3 |
| 3 | 1 | 0 | 0 | 0 | 1 | 1 | 1 | 1 | x2–x3 | y2–y4 |
| 4 | 1 | 1 | 1 | 1 | 1 | 1 | 1 | 1 | x3–x4 | y3–y5 |
| 5 | 1 | 1 | 1 | 1 | 0 | 0 | 0 | 0 | x4–x5 | y4–y6 |
| 6 | 0 | 0 | 1 | 0 | 0 | 0 | 0 | 0 | x5–x6 | y5–y7 |
| 7 | 0 | 0 | 1 | 1 | 1 | 1 | 1 | 0 | x6–x7 | y6–y8 |
| 8 | 0 | 1 | 1 | 1 | 1 | 1 | 1 | 0 | x7–x8 | y7–ym |
| 9 | 0 | 1 | 1 | 1 | 1 | 1 | 0 | 0 | x8–xm | |

10b) There are no free subareas.
11a) The dimension of the matrix is reduced in the x-direction to an (8×8) matrix:

| x = y = | 1 | 2 | 3 | 4 | 5 | 6 | 7 | 8 | x | y |
|---|---|---|---|---|---|---|---|---|---|---|
| 2 | 1 | 0 | 0 | 0 | 1 | 1 | 0 | 0 | x1–x3 | y1–y3 |
| 3 | 1 | 0 | 0 | 0 | 1 | 1 | 1 | 1 | x2–x4 | y2–y4 |
| 4 | 1 | 1 | 1 | 1 | 1 | 0 | 0 | 0 | x3–x5 | y3–y5 |
| 5 | 0 | 0 | 0 | 1 | 0 | 0 | 0 | 0 | x4–x6 | y4–y6 |
| 6 | 0 | 0 | 0 | 1 | 0 | 0 | 0 | 0 | x5–x7 | y5–y7 |
| 7 | 0 | 0 | 0 | 1 | 1 | 1 | 1 | 0 | x6–x8 | y6–y8 |
| 8 | 0 | 1 | 1 | 1 | 1 | 1 | 0 | 0 | x7–xm | y7–ym |

11b) There are no free subareas.
12a) The dimension of the matrix is reduced in the x-direction to a (7×8) matrix:

| x = y = | 1 | 2 | 3 | 4 | 5 | 6 | 7 | 8 | x | y |
|---|---|---|---|---|---|---|---|---|---|---|
| 1 | 0 | 0 | 0 | 0 | 1 | 1 | 0 | 0 | 0–x3 | 0–y2 |
| 2 | 1 | 0 | 0 | 0 | 1 | 1 | 0 | 0 | x1–x4 | y1–.. |
| 3 | 1 | 0 | 0 | 0 | 1 | 0 | 0 | 0 | x2–x5 | ..–.. |
| 4 | 0 | 0 | 0 | 1 | 0 | 0 | 0 | 0 | x3–x6 | ..–y8 |
| 5 | 0 | 0 | 0 | 1 | 0 | 0 | 0 | 0 | x4–x7 | y7–ym |
| 6 | 0 | 0 | 0 | 1 | 0 | 0 | 0 | 0 | x5–x8 | |
| 7 | 0 | 0 | 0 | 1 | 1 | 1 | 0 | 0 | x6–xm | |

12b) There are no free subareas.
12a) The dimension of the matrix is reduced in the x-direction to a (6×8) matrix:

| x = y = | 1 | 2 | 3 | 4 | 5 | 6 | 7 | 8 | x | y |
|---|---|---|---|---|---|---|---|---|---|---|
| 1 | 0 | 0 | 0 | 0 | 1 | 1 | 0 | 0 | 0–x4 | 0–y2 |
| 2 | 1 | 0 | 0 | 0 | 1 | 0 | 0 | 0 | x1–x5 | y1–.. |
| 3 | 0 | 0 | 0 | 0 | 0 | 0 | 0 | 0 | x2–x6 | ..–.. |
| 4 | 0 | 0 | 0 | 1 | 0 | 0 | 0 | 0 | x3–x7 | ..–y8 |
| 5 | 0 | 0 | 1 | 0 | 0 | 0 | 0 | 0 | x4–x8 | y7–ym |
| 6 | 0 | 0 | 0 | 1 | 0 | 0 | 0 | 0 | x5–xm | |

13b) There is one free subarea: (x1,0)—(x5,y2) [2]
14a) The dimension of the matrix is reduced in the x-direction to a (5×8) matrix:

| x = y = | 1 | 2 | 3 | 4 | 5 | 6 | 7 | 8 | x | y |
|---|---|---|---|---|---|---|---|---|---|---|
| 1 | 0 | 0 | 0 | 0 | 1 | 0 | 0 | 0 | 0–x5 | 0–y2 |
| 2 | 0 | 0 | 0 | 0 | 0 | 0 | 0 | 0 | x1–x6 | y1–.. |
| 3 | 0 | 0 | 0 | 0 | 0 | 0 | 0 | 0 | x2–x7 | ..–.. |
| 4 | 0 | 0 | 0 | 1 | 0 | 0 | 0 | 0 | x3–x8 | ..–y8 |
| 5 | 0 | 0 | 0 | 1 | 0 | 0 | 0 | 0 | x4–xm | y7–ym |

14b) There is one free subarea: (0,y4)—(x5,y6) [3]
5a) The dimension of the matrix is reduced in the x-direction to a (4×8) matrix:

| x = y = | 1 | 2 | 3 | 4 | 5 | 6 | 7 | 8 | x | y |
|---|---|---|---|---|---|---|---|---|---|---|
| 1 | 0 | 0 | 0 | 0 | 0 | 0 | 0 | 0 | 0–x6 | 0–y2 |
| 2 | 0 | 0 | 0 | 0 | 0 | 0 | 0 | 0 | x1–x7 | y1–.. |
| 3 | 0 | 0 | 0 | 0 | 0 | 0 | 0 | 0 | x2–x8 | ..–.. |
| 4 | 0 | 0 | 0 | 1 | 0 | 0 | 0 | 0 | x3–xm | ..–y8 |
| | | | | | | | | | | y7–ym |

15b) There is one free subarea: (x3,y3)—(xm,y5) [4]
16a) The dimension of the matrix is reduced in the x-direction to a (3×8) matrix:

| x = y = | 1 | 2 | 3 | 4 | 5 | 6 | 7 | 8 | x | y |
|---|---|---|---|---|---|---|---|---|---|---|
| 1 | 0 | 0 | 0 | 0 | 0 | 0 | 0 | 0 | 0–x7 | 0–y2 |
| 2 | 0 | 0 | 0 | 0 | 0 | 0 | 0 | 0 | x1–x8 | y1–.. |
| 3 | 0 | 0 | 0 | 0 | 0 | 0 | 0 | 0 | x2–xm | ..–.. |

16b) There are no free subareas.
17a) There is no point in further reducing the x-direction because the matrix has become zero. The matrix from 10) is now reduced in the y-direction to a (9×7) matrix:

| x = y = | 1 | 2 | 3 | 4 | 5 | 6 | 7 | x | y |
|---|---|---|---|---|---|---|---|---|---|
| 1 | 0 | 0 | 0 | 0 | 1 | 0 | 0 | 0–x1 | 0–y3 |
| 2 | 0 | 0 | 0 | 0 | 1 | 0 | 0 | x1–x2 | y1–y4 |
| 3 | 0 | 0 | 0 | 0 | 1 | 1 | 1 | x2–x3 | y2–y5 |
| 4 | 1 | 1 | 1 | 1 | 1 | 1 | 1 | x3–x4 | y3–y6 |
| 5 | 1 | 1 | 1 | 1 | 0 | 0 | 0 | x4–x5 | y4–y7 |
| 6 | 0 | 0 | 0 | 0 | 0 | 0 | 0 | x5–x6 | y5–y8 |
| 7 | 0 | 0 | 0 | 1 | 1 | 1 | 0 | x6–x7 | y6–ym |
| 8 | 0 | 1 | 1 | 1 | 1 | 1 | 0 | x7–x8 | |
| 9 | 0 | 1 | 1 | 1 | 1 | 0 | 0 | x8–xm | |

17b) There are no free subareas.
18a) The dimension of the matrix is reduced in the x-direction to an (8×7) matrix:

| x = y = | 1 | 2 | 3 | 4 | 5 | 6 | 7 | x | y |
|---|---|---|---|---|---|---|---|---|---|
| 1 | 0 | 0 | 0 | 0 | 1 | 0 | 0 | 0–x1 | 0–y1 |
| 2 | 0 | 0 | 0 | 0 | 1 | 0 | 0 | x1–x3 | y1–y4 |
| 3 | 0 | 0 | 0 | 0 | 1 | 1 | 1 | x2–x4 | y2–y5 |
| 4 | 1 | 1 | 1 | 1 | 0 | 0 | 0 | x3–x5 | y3–y6 |
| 5 | 0 | 0 | 0 | 0 | 0 | 0 | 0 | x4–x7 | y4–y7 |
| 6 | 0 | 0 | 0 | 0 | 0 | 0 | 0 | x5–x7 | y5–y8 |
| 7 | 0 | 0 | 0 | 1 | 1 | 1 | 0 | x6–x8 | y6–ym |
| 8 | 0 | 1 | 1 | 1 | 1 | 0 | 0 | x7–xm | |

18b) There are no free subareas.
19a) The dimension of the matrix is reduced in the x-direction to a (7×7) matrix:

| x = y = | 1 | 2 | 3 | 4 | 5 | 6 | 7 | x | y |
|---|---|---|---|---|---|---|---|---|---|
| 1 | 0 | 0 | 0 | 0 | 1 | 0 | 0 | 0–x3 | 0–y3 |
| 2 | 0 | 0 | 0 | 0 | 1 | 0 | 0 | x1–x4 | y1–y4 |
| 3 | 0 | 0 | 0 | 0 | 0 | 0 | 0 | x2–x5 | y2–y5 |
| 4 | 0 | 0 | 0 | 0 | 0 | 0 | 0 | x3–x6 | y3–y6 |
| 5 | 0 | 0 | 0 | 0 | 0 | 0 | 0 | x4–x7 | y4–y7 |
| 6 | 0 | 0 | 0 | 0 | 0 | 0 | 0 | x5–x8 | y5–y8 |
| 7 | 0 | 0 | 0 | 1 | 1 | 0 | 0 | x6–xm | y6–ym |

19b) There are no free subareas.
20a) The dimension of the matrix is reduced in the x-direction to a (6×7) matrix:

| x = y = | 1 | 2 | 3 | 4 | 5 | 6 | 7 | x | y |
|---|---|---|---|---|---|---|---|---|---|
| 1 | 0 | 0 | 0 | 0 | 1 | 0 | 0 | 0–x4 | 0–y3 |
| 2 | 0 | 0 | 0 | 0 | 0 | 0 | 0 | x1–x5 | y1–y4 |
| 3 | 0 | 0 | 0 | 0 | 0 | 0 | 0 | x2–x6 | y2–y5 |
| 4 | 0 | 0 | 0 | 0 | 0 | 0 | 0 | x3–x7 | y3–y6 |
| 5 | 0 | 0 | 0 | 0 | 0 | 0 | 0 | x4–x8 | y4–y7 |
| 6 | 0 | 0 | 0 | 0 | 0 | 0 | 0 | x5–xm | y5–y8 |
| | | | | | | | | | y6–ym |

20b) There is one free subarea: (0,y4)–(x4,y7) [5]
21a) The dimension of the matrix is reduced in the x-direction to a (5×7) matrix:

| x = y = | 1 | 2 | 3 | 4 | 5 | 6 | 7 | x | y |
|---|---|---|---|---|---|---|---|---|---|
| 1 | 0 | 0 | 0 | 0 | 0 | 0 | 0 | 0–x5 | 0–y3 |
| 2 | 0 | 0 | 0 | 0 | 0 | 0 | 0 | x1–x6 | y1–y4 |
| 3 | 0 | 0 | 0 | 0 | 0 | 0 | 0 | x2–x7 | y2–y5 |
| 4 | 0 | 0 | 0 | 0 | 0 | 0 | 0 | x3–x8 | y3–y6 |
| 5 | 0 | 0 | 0 | 0 | 0 | 0 | 0 | x4–xm | y4–y7 |
| | | | | | | | | | y5–y8 |
| | | | | | | | | | y6–ym |

21b) There are no free subareas.
22a) There is no point in reducing in the x-direction because the matrix is zero. The matrix from 17) is now reduced in the y-direction to a (9×6) matrix:

| x = y = | 1 | 2 | 3 | 4 | 5 | 6 | x | y |
|---|---|---|---|---|---|---|---|---|
| 1 | 0 | 0 | 0 | 0 | 0 | 0 | 0–x1 | 0–y4 |
| 2 | 0 | 0 | 0 | 0 | 0 | 0 | x1–x2 | y1–y5 |
| 3 | 0 | 0 | 0 | 0 | 1 | 1 | x2–x3 | y2–y6 |
| 4 | 1 | 1 | 1 | 1 | 1 | 1 | x3–x4 | y3–y7 |
| 5 | 1 | 1 | 1 | 0 | 0 | 0 | x4–x5 | y4–y8 |
| 6 | 0 | 0 | 0 | 1 | 1 | 0 | x6–x7 | |
| 8 | 0 | 1 | 1 | 1 | 1 | 0 | x7–x8 | |
| 9 | 0 | 1 | 1 | 1 | 0 | 0 | x8–xm | |

22b) There are no free subareas.
23a) The dimension of the matrix is reduced in the x-direction to an (8×6) matrix:

| x = y = | 1 | 2 | 3 | 4 | 5 | 6 | x | y |
|---|---|---|---|---|---|---|---|---|
| 1 | 0 | 0 | 0 | 0 | 0 | 0 | 0–x2 | 0–y4 |
| 2 | 0 | 0 | 0 | 0 | 0 | 0 | x1–x3 | y1–y5 |
| 3 | 0 | 0 | 0 | 0 | 1 | 1 | x2–x4 | y2–y6 |
| 4 | 1 | 1 | 1 | 0 | 0 | 0 | x3–x5 | y3–y7 |
| 5 | 0 | 0 | 0 | 0 | 0 | 0 | x4–x6 | y4–y8 |
| 6 | 0 | 0 | 0 | 0 | 0 | 0 | x5–x7 | y5–ym |
| 7 | 0 | 0 | 0 | 1 | 1 | 0 | x6–x8 | |
| 8 | 0 | 1 | 1 | 1 | 0 | 0 | x7–xm | |

23b) There are no free subareas.
24a) The dimension of the matrix is reduced in the x-direction to a (7×6) matrix:

| x = y = | 1 | 2 | 3 | 4 | 5 | 6 | x | y |
|---|---|---|---|---|---|---|---|---|
| 1 | 0 | 0 | 0 | 0 | 0 | 0 | 0–x3 | 0–y4 |
| 2 | 0 | 0 | 0 | 0 | 0 | 0 | x1–x4 | y1–y5 |
| 3 | 0 | 0 | 0 | 0 | 0 | 0 | x2–x5 | y2–y6 |
| 4 | 0 | 0 | 0 | 0 | 0 | 0 | x3–x6 | y3–y7 |
| 5 | 0 | 0 | 0 | 0 | 0 | 0 | x4–x7 | y4–y8 |
| 6 | 0 | 0 | 0 | 0 | 0 | 0 | x5–x8 | y5–ym |
| 7 | 0 | 0 | 0 | 1 | 0 | 0 | x6–xm | |

24) There is one free subarea: (x6,y3)–(xm,y7) [6]
25a) The dimension of the matrix is reduced in the x-direction to a (5×6) matrix:

| x = y = | 1 | 2 | 3 | 4 | 5 | 6 | x | y |
|---|---|---|---|---|---|---|---|---|
| 1 | 0 | 0 | 0 | 0 | 0 | 0 | 0–x4 | 0–y4 |
| 2 | 0 | 0 | 0 | 0 | 0 | 0 | x1–x5 | y1–y5 |
| 3 | 0 | 0 | 0 | 0 | 0 | 0 | x2–x6 | y2–y6 |
| 4 | 0 | 0 | 0 | 0 | 0 | 0 | x3–x7 | y3–y7 |
| 5 | 0 | 0 | 0 | 0 | 0 | 0 | x4–x8 | y4–y8 |
| 6 | 0 | 0 | 0 | 0 | 0 | 0 | x5–xm | y5–ym |

26b) There are no free subareas.
27a) There is no point in reducing in the x-direction because the matrix is zero. The matrix from 23) is now reduced in the y-direction to a (9×5) matrix:

| x = y = | 1 | 2 | 3 | 4 | 5 | x | y |
|---|---|---|---|---|---|---|---|
| 1 | 0 | 0 | 0 | 0 | 0 | 0-x1 | 0-y5 |
| 2 | 0 | 0 | 0 | 0 | 0 | x1-x2 | y1-y6 |
| 3 | 0 | 0 | 0 | 0 | 1 | x2-x3 | y2-y7 |
| 4 | 1 | 1 | 1 | 1 | 1 | x3-x4 | y3-y8 |
| 5 | 1 | 1 | 0 | 0 | 0 | x4-x5 | y4-ym |
| 6 | 0 | 0 | 0 | 0 | 0 | x5-x6 | |
| 7 | 0 | 0 | 0 | 1 | 0 | x6-x7 | |
| 8 | 0 | 1 | 1 | 1 | 0 | x7-x8 | |
| 9 | 0 | 1 | 1 | 0 | 0 | x8-xm | |

27b) There are no free subareas.
28a) The dimension of the matrix is reduced in the x-direction to a (5×8) matrix:

| x = y = | 1 | 2 | 3 | 4 | 5 | x | y |
|---|---|---|---|---|---|---|---|
| 1 | 0 | 0 | 0 | 0 | 0 | 0-x2 | 0-y5 |
| 2 | 0 | 0 | 0 | 0 | 0 | x1-x3 | y1-y6 |
| 3 | 0 | 0 | 0 | 0 | 1 | x2-x4 | y2-y7 |
| 4 | 1 | 1 | 0 | 0 | 0 | x3-x5 | y3-y8 |
| 5 | 0 | 0 | 0 | 0 | 0 | x4-x6 | y4-ym |
| 6 | 0 | 0 | 0 | 0 | 0 | x5-x7 | |
| 7 | 0 | 0 | 0 | 1 | 0 | x6-x8 | |
| 8 | 0 | 1 | 1 | 0 | 0 | x7-xm | |

28b) There are two free subareas: (x2, y4)−(x4, ym)[7] (x6,y3)−(x8,y8) [8]
29a) The dimension of the matrix is reduced in the x-direction to a (5×7) matrix:

| x = y = | 1 | 2 | 3 | 4 | 5 | x | y |
|---|---|---|---|---|---|---|---|
| 1 | 0 | 0 | 0 | 0 | 0 | 0-x3 | 0-y5 |
| 2 | 0 | 0 | 0 | 0 | 0 | x1-x4 | y1-y6 |
| 3 | 0 | 0 | 0 | 0 | 0 | x2-x5 | y2-y7 |
| 4 | 0 | 0 | 0 | 0 | 0 | x3-x6 | y3-y8 |
| 5 | 0 | 0 | 0 | 0 | 0 | x4-x7 | y4-ym |
| 6 | 0 | 0 | 0 | 0 | 0 | x5-x8 | |
| 7 | 0 | 0 | 0 | 0 | 0 | x6-xm | |

29b) There are no free subareas.
30a) There is no point in reducing in the x-direction because the matrix is zero. The matrix from 27) is now reduced in the y-direction to a (9×4) matrix:

| x = y = | 1 | 2 | 3 | 4 | x | y |
|---|---|---|---|---|---|---|
| 1 | 0 | 0 | 0 | 0 | 0-x1 | 0-y6 |
| 2 | 0 | 0 | 0 | 0 | x1-x2 | y1-y7 |
| 3 | 0 | 0 | 0 | 0 | x2-x3 | y2-y8 |
| 4 | 1 | 1 | 1 | 1 | x3-x4 | y3-ym |
| 5 | 1 | 0 | 0 | 0 | x4-x5 | |
| 6 | 0 | 0 | 0 | 0 | x5-x6 | |
| 7 | 0 | 0 | 0 | 0 | x6-x7 | |
| 8 | 0 | 1 | 1 | 0 | x7-x8 | |
| 9 | 0 | 1 | 0 | 0 | x8-xm | |

30b) There are no free subareas.
31a) The dimension of the matrix is reduced in the x-direction to an (8×4) matrix:

| x = y = | 1 | 2 | 3 | 4 | x | y |
|---|---|---|---|---|---|---|
| 1 | 0 | 0 | 0 | 0 | 0-x2 | 0-y6 |
| 2 | 0 | 0 | 0 | 0 | x1-x3 | y1-y7 |
| 3 | 0 | 0 | 0 | 0 | x2-x4 | y2-y8 |
| 4 | 1 | 0 | 0 | 0 | x3-x5 | y3-ym |
| 5 | 0 | 0 | 0 | 0 | x4-x6 | |
| 6 | 0 | 0 | 0 | 0 | x5-x7 | |
| 7 | 0 | 0 | 0 | 0 | x6-x8 | |
| 8 | 0 | 1 | 0 | 0 | x7-xm | |

31b) There are two free subareas: (x3,0)−(x5,y6) [9](x7,y1)−(xm,y7) [10]
32a) The dimension of the matrix is reduced in the x-direction to a (5×7) matrix:

| x = y = | 1 | 2 | 3 | 4 | x | y |
|---|---|---|---|---|---|---|
| 1 | 0 | 0 | 0 | 0 | 0-x3 | 0-y6 |
| 2 | 0 | 0 | 0 | 0 | x1-x4 | y1-y7 |
| 3 | 0 | 0 | 0 | 0 | x2-x5 | y2-y8 |
| 4 | 0 | 0 | 0 | 0 | x3-x6 | y3-ym |
| 5 | 0 | 0 | 0 | 0 | x4-x7 | |
| 6 | 0 | 0 | 0 | 0 | x5-x8 | |
| 7 | 0 | 0 | 0 | 0 | x6-xm | |

32b) There are no free subareas.
33a) There is no point in reducing in the x-direction because the matrix is zero. The matrix from 30) is now reduced in the y-direction to a (9×3) matrix:

| x = y = | 1 | 2 | 3 | x | y |
|---|---|---|---|---|---|
| 1 | 0 | 0 | 0 | 0-x1 | 0-y7 |
| 2 | 0 | 0 | 0 | x1-x2 | y1-y8 |
| 3 | 0 | 0 | 0 | x2-x3 | y2-ym |
| 4 | 1 | 1 | 1 | x3-x4 | |
| 5 | 0 | 0 | 0 | x4-x5 | |
| 6 | 0 | 0 | 0 | x5-x6 | |
| 7 | 0 | 0 | 0 | x6-x7 | |
| 8 | 0 | 1 | 0 | x7-x8 | |
| 9 | 0 | 0 | 0 | x8-xm | |

33b) There is one free subarea: (x7, y1)−(x8,y8) [11]
34a) The dimension of the matrix is now reduced in the x-direction to an (8×3) matrix:

| x = y = | 1 | 2 | 3 | x | y |
|---|---|---|---|---|---|
| 1 | 0 | 0 | 0 | 0-x2 | 0-y7 |
| 2 | 0 | 0 | 0 | x1-x3 | y1-y8 |
| 3 | 0 | 0 | 0 | x2-x4 | y2-ym |
| 4 | 0 | 0 | 0 | x3-x5 | |
| 5 | 0 | 0 | 0 | x4-x6 | |
| 6 | 0 | 0 | 0 | x5-x7 | |
| 7 | 0 | 0 | 0 | x6-x8 | |
| 8 | 0 | 0 | 0 | x7-xm | |

34b) There are no free subareas.
35a) There is no point in reducing in the x-direction because the matrix is zero. The matrix from 33) is now reduced in the y-direction to a (9×2) matrix:

| x = y = | 1 | 2 | x | y |
|---|---|---|---|---|
| 1 | 0 | 0 | 0-x1 | 0-y8 |
| 2 | 0 | 0 | x1-x2 | y1-ym |
| 3 | 0 | 0 | x2-x3 | |
| 4 | 1 | 1 | x3-x4 | |
| 5 | 0 | 0 | x4-x5 | |
| 6 | 0 | 0 | x5-x6 | |
| 7 | 0 | 0 | x6-x7 | |
| 8 | 0 | 0 | x7-x8 | |
| 9 | 0 | 0 | x8-xm | |

35b) There are no free subareas.
36a) The dimension of the matrix is reduced in the x-direction to an (8×2) matrix:

| x = | y = | 1 | 2 | x | y |
|---|---|---|---|---|---|
| 1 | | 0 | 0 | 0-x2 | 0-y8 |
| 2 | | 0 | 0 | x1-x3 | y1-ym |
| 3 | | 0 | 0 | x2-x4 | |
| 4 | | 0 | 0 | x3-x5 | |
| 5 | | 0 | 0 | x4-x6 | |
| 6 | | 0 | 0 | x5-x7 | |
| 7 | | 0 | 0 | x6-x8 | |
| 8 | | 0 | 0 | x7-xm | |

36b) There are no free subareas.

37a) There is no point in further reducing in the x-direction. The dimension of the matrix is reduced in the x=-direction to an (8×1) matrix:

| x = | y = | 1 | x | y |
|---|---|---|---|---|
| 1 | | 0 | 0-x1 | 0-ym |
| 2 | | 0 | x1-x2 | |
| 3 | | 0 | x2-x3 | |
| 4 | | 1 | x3-x4 | |
| 5 | | 0 | x4-x5 | |
| 6 | | 0 | x5-x6 | |
| 7 | | 0 | x6-x7 | |
| 8 | | 0 | x7-x8 | |
| 9 | | 0 | x8-xm | |

37b) There is one free subarea: (x3, 0)−(x4,ym) [12]

38a) The dimension of the matrix is reduced in the x-direction to an (8×1) matrix:

| x = | y = | 1 | x | y |
|---|---|---|---|---|
| 1 | | 0 | 0-x2 | 0-ym |
| 2 | | 0 | x1-x3 | |
| 3 | | 0 | x2-x4 | |
| 4 | | 0 | x3-x5 | |
| 5 | | 0 | x4-x6 | |
| 6 | | 0 | x6-x8 | |
| 8 | | 0 | x7-xm | |

38b) There is no free subarea.

39a) There is no point in further reducing in the x-direction. 37) cannot be reduced further in the y-direction either. The matrix reduction has therefore been completed.

Of the maximum of 9×9=81 possible reduction steps, only 39 have been necessary in order to find all the free subareas.

Figure 2:
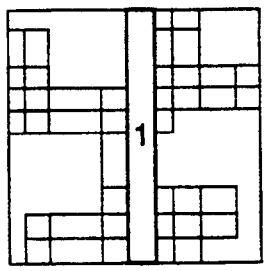
FIG. 2 shows schematically the free subareas found with the aid of the method according to the invention.
Figure 2:
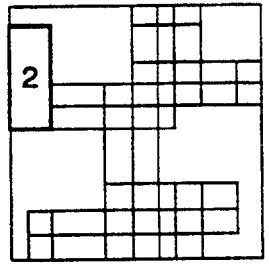
Figure 2:
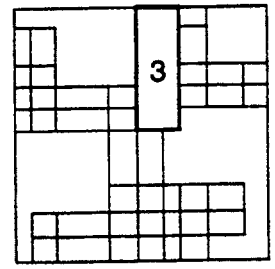
Figure 2:
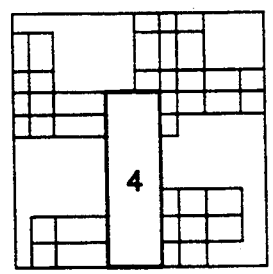
Figure 2:
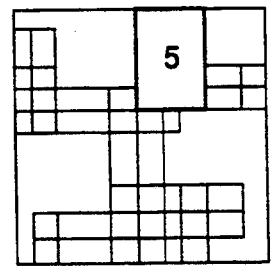
Figure 2:
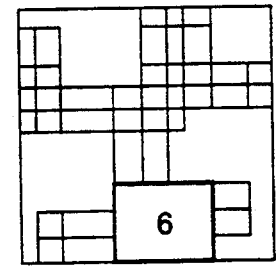
Figure 2:
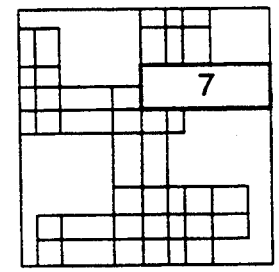
Figure 2:
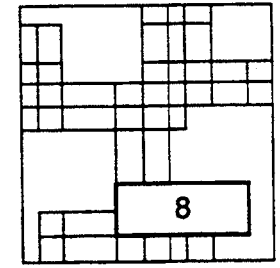
Figure 2:
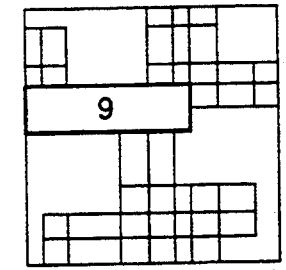
Figure 2:
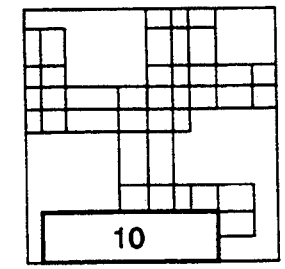
Figure 2:
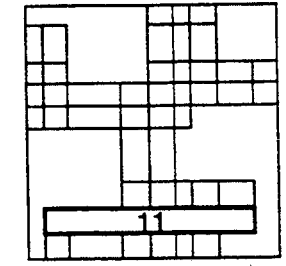
Figure 2:
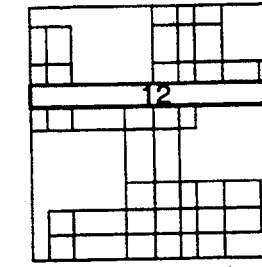

By means of the matrix reduction and by reading of the continuously adjusted dimension tables, a total of 12 free subareas have been found and these are reproduced again below. The position of the free subareas found in the matrix is shown in FIG. 2.

[1] (0,y4)−(xm,y5) [2] (x1,0)−(x5,y2)
[3] (0,y4)−(x5,y6) [49 (x3,y3)−(xm,y5)
[5] (0,y4)−(x4,y7) [6] (x6,y3)−(xm,y7)
[7] (x2,y4)−(x4,ym) [8] (x6,y3)−(x8,y8)
[9] (x3,0)−(x5,y6) [10] (x7,y1)−(xm,y7)
[11] (x7,y1)-(x8,y8) [12] (x3,0)−(x4,ym)

The free spaces in a three-dimensional space having the shape of a right parallelepiped can also be determined in an analogous manner. If the third dimension, for example the height of the space to be filled, is termed z, a three-dimensional matrix having z=z1, z2, . . . zm has to be determined. By analogy with the principle described above for the two-dimensional case, there is a free space at the position $(x_l, y_l, z_l)$ in the space if:

$(x_l, y_l, z_l) = 1$ and $(x_{l-1}, y_l, z_l) = 0$ and $(x_{l+1}, y_l, z_l) = 0$ and $(x_l, y_{l-1}, z_l) = 0$ and $(x_l, y_{l+1}, z_l) = 0$ and $(x_l, y_l, z_{l-1}) = 0$ and $(x_l, y_l, z_{l+1}) = 0$. (IV)

By reducing the matrix in the x-, y- or z-direction, (IV) can now be used to search for larger spaces again, the dimensions of said spaces again being determined in the same way as in the two-dimensional case by the number of times that a reduction is carried out in the x-direction and/or the y-direction and/or the z-direction, respectively.

Analogously to the two-dimensional case, the matrix is reduced in the x-direction by determining for each element $(x_l, y_l, z_l)$ of the matrix whether:

$(x_l, y_l, z_l) = 1$ and $(x_{l+1}, y_l z_l) = 1$ (V), in which case $(x_l, y_l, z_l)' := 1$ and if (V) is not satisfied, $(x_l, y_l, z_l)' = 0$.

The reduction in the y-direction determines whether:

$(x_l, y_l, z_l) = 1$ and $(x_l, Y_{l+1}, z_l) = 1$ (VI), in which case $(x_l, y_l, z_l)' := 1$, and if (VI) is not satisfied, $(x_l, y_l, z_l)' = 0$.

Finally, the reduction in the z-direction determines whether:

$(x_l, y_l, z_l) = 1$ and $(x_l, y_l, z_{l+1}) = 1$ (VII), in which case $(x_l, y_l, z_l)' := 1$, and if (VII) is not satisfied, $(x_l, y_l, z_l)' = 0$.

To determine the exact position of the free spaces found using (IV), dimension tables are also updated in the three-dimensional case for the x-, y- and z-direction and these are adjusted during reduction of the matrices in the x-, y- and z-direction, respectively.

A three-dimensional matrix is reduced in accordance with the procedure below:

```
                     (X,Y,Z)
           (X-1,Y,Z)   (X,Y-1,Z)   (X,Y,Z-1)

(X-2,Y,Z)   (X,Y-2,Z)   (X-1,Y,Z-1)   (X,Y,Z-2)

(X-1,Y-1,Z)              (X,Y-1,Z-1)
   ..............................................
   ..............................................
   (1,1,2)              (1,2,1)              (2,1,1)
                        (1,1,1)
```

Starting from the second "layer" in this procedure, a reduced matrix can be obtained via various routes, it being possible in principle to find free spaces via the various routes, but it being certain that all the existing free spaces are found if the entire reduction is carried out until either the (1, 1, 1) matrix is reached or the last reduced matrix in each dimension is a null matrix.

Figure 3A:
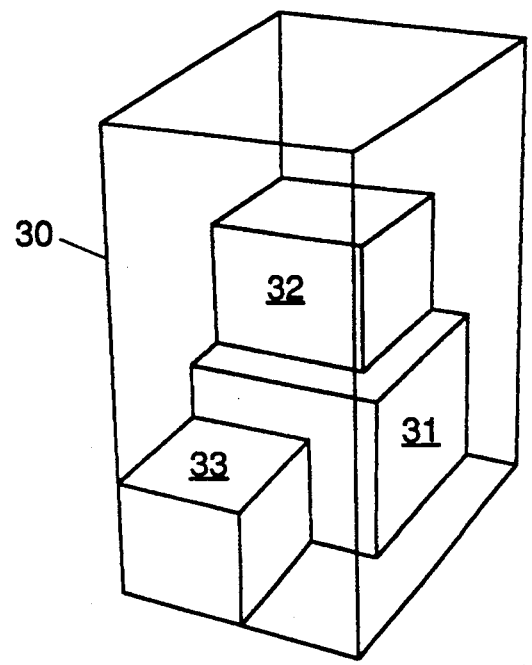
FIG. 3a shows in a perspective view a three-dimensional space partially filled with three objects.
Figure 3B:
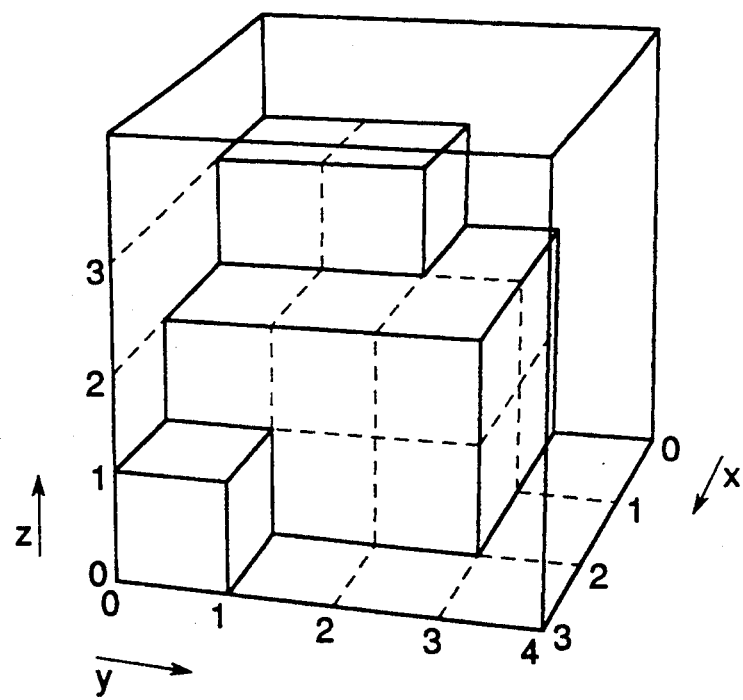

As an example FIG. 3a shows in a perspective view a three-dimensional space 30 having the shape of a right parallelepiped partially filled with three objects 31, 32 and 33 each having also the right parallelepiped shape. FIG. 3b shows schematically the conversion of the situation shown in FIG. 3a to a three-dimensional matrix representation. This three-dimensional matrix representation is considered as a number of two-dimensional matrix representation layered above each other in the z-direction, i.e.:

for z = 1:

| x = | y = 1 | 2 | 3 | 4 |
|---|---|---|---|---|
| 1 | 0 | 0 | 0 | 1 |
| 2 | 0 | 0 | 0 | 1 |
| 3 | 0 | 1 | 1 | 1 | for z = 2:

| x = | y = 1 | 2 | 3 | 4 |
|---|---|---|---|---|
| 1 | 0 | 0 | 0 | 1 |
| 2 | 0 | 0 | 0 | 1 |
| 3 | 1 | 1 | 1 | 1 |

-continued

```
for z = 3:              for z = 4:
    y = 1 2 3 4             y = 1 2 3 4
x =                     x =
    1 | 0 0 1 1             1 | 1 1 1 1
    2 | 1 1 1 1             2 | 1 1 1 1
    3 | 1 1 1 1             3 | 1 1 1 1
```

To determine the dimensions of the free spaces found, the following three dimension tables are updated whose length coresponds to the number of rows (x-direction), columns (y-direction) and layers (z-direction), respectively of the three-dimensional matrix:

| x | y | z |
|---|---|---|
| 0 –x1 | 0 –y1 | 0 –z1 |
| x1–x2 | y1–y2 | z1–z2 |
| x2–xm | y2–y3 | z2–z3 |
|  | y3–ym | z3–zm |

The reduction procedure carried out on this three-dimensional matrix leads to the following free spaces:

{1} (0,y3,0)–(xm,ym,zm)  {2} (x2,y1,0)–(xm,ym,zm)  {3} (x2,0,z1)–(xm,ym,zm)  {4} (x1,0,z2)–(xm,ym,zm) {5} (0,y2,z2)–(xm,ym,zm) {6} (0,0,z3)–(xm,ym,zm)

Figure 4:
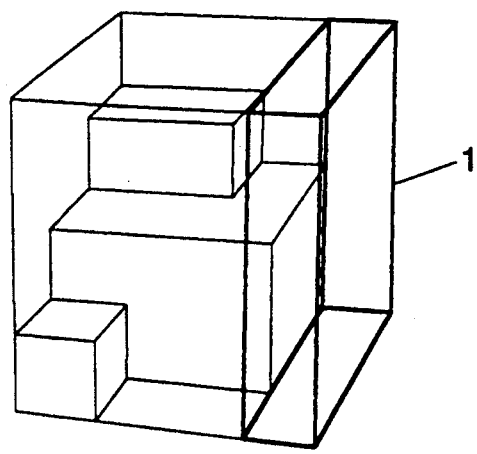
FIG. 4 shows schematically the free subspaces found with the aid of the mehtod according to the invention.
Figure 4:
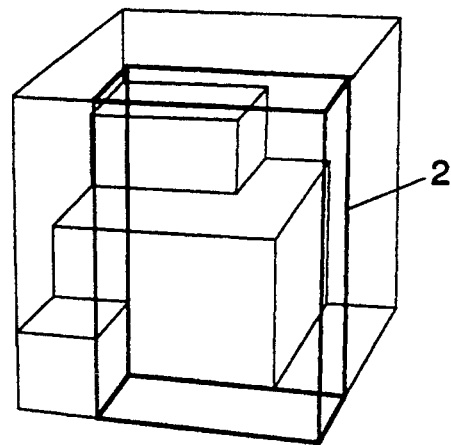
Figure 4:
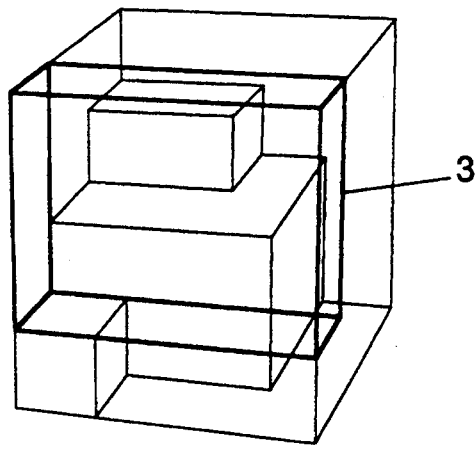
Figure 4:
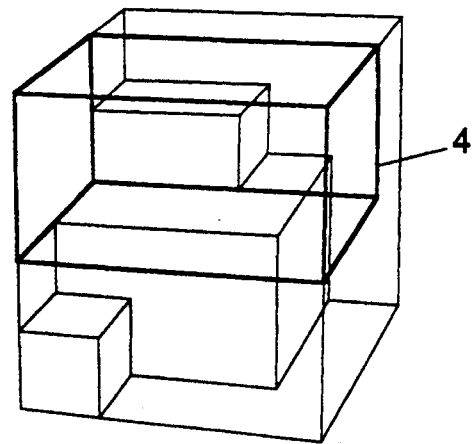
Figure 4:
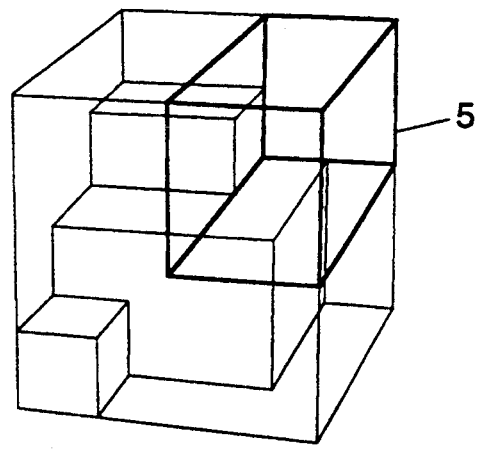
Figure 4:
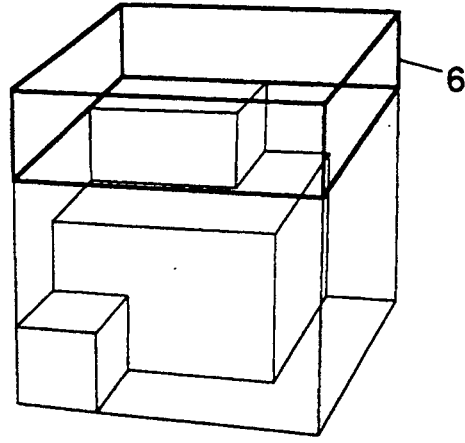

The position of each of the free spaces found is shown in FIG. 4 (drawn in bold lines).

After positioning an object in one of the free spaces found, the matrix has to be adjusted to the new situation, after which free spaces can be sought for a subsequent object. The matrix is adjusted as follows: When a package is positioned in a free space found, account has to be taken in each of the dimensions in the new situation of not more than two new coordinates which indicate the boundaries of the package positioned. These coordinates are $x_a$, $y_a$, $z_a$ and $x_b$, $Y_b$, $Z_b$; at least some of the new coordinates correspond to coordinates which were already included in one of the dimension tables because a new object never ends up freely suspended in the space, but always against one or more of the walls of the space to be filled and/or against the sides of adjacent, already positioned objects. On the basis of the available dimension table of the original matrix, it is possible to determine where the coordinates of the freshly positioned object should be positioned in the tables. Because the new coordinates have been inserted in the relevant position in the dimension table, the matrix increases by not more than two elements in each dimension. The matrix representation can be immediately adjusted in this way after positioning a new object in said representation, with the result that the complete representation does not have to be continuously recalculated. The complexity of the calculation work necessary increases as the dimensions of the matrix increase, but this effect is at least partly nullified by the following two factors. Firstly, free spaces having dimensions which are smaller than predetermined minimum dimensions are deleted from the matrix and the tables, for example because it is known that no objects having smaller dimensions than said minimum dimensions are available, and secondly, during the loading of the space by positioning an object, adjacent layers often become equal to one another and in that case the two layers can be replaced by one of said layers, with the result that the matrix representation and therefore also the associated dimension tables are simplified. In this way, the increase in the complexity of the matrix and therefore the increase in the calculation work necessary as a consequence of positioning new packages can be compensated for at least partly.

Now that it has been explained how suitable rectangular subareas on a floor area or rectangular subspaces in a rectangular container space partly occupied by rectangular objects can be found for placement of another rectangular object on the floor area or in the container space, the method for optimizing the placement of rectangular objects according to the invention can be described in ordinary language and with reference to relatively simple treatment of space and object dimensions.

When assessing a parcel/space combination it is determined how well a given parcel in a defined position fits in a given free space. An assessment of this type in principle only requires the dimensions of the space and the parcel dimensions in relation thereto. The support of the parcel, a preference for a specific space or a preference for a specific position etc. may, if desired, subsequently be incorporated in the assessment.

In the example described the following dimensions are assumed.

Space dimensions: (Xs, Ys, Zs)
Parcel dimensions: (Xp, Yp, Zp)
Herein X is the depth, Y is the width and Z the height of the space and the parcel, respectively.

First a description is given of how the situations are assessed where Xp<Xs and Yp<Ys and Zp<Zs. If one or more parcel dimensions are equal to the space dimensions, the assessment will generally have to be biased in a particular way, for example by an additional evaluation.

In general, an assessment of the measure of the fit can be approached in two ways. It is possible to assess how well a parcel fills the space or it is possible to assess how "good" is the shape of the remaining space.

Based on the firstmentioned criterion, it is easy to determine the degree of filling (C1):

$$C1:=[Xp/Xs]*[Yp/Ys]*[Zp/Zs]$$

Figure 5:
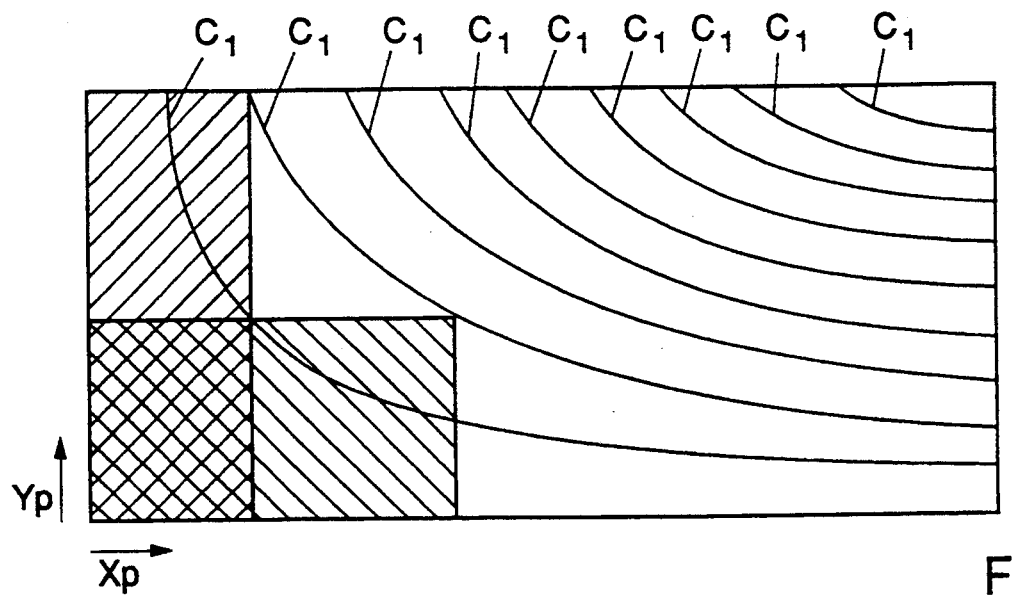
FIG. 5 shows a diagrammatic illustration of a first way of assessing the fit.

C1 is a number between 0 and 1, indicating what fraction of the space is filled. The greater the numerical value of C1, the better the fill. FIG. 5 shows what this degree of filling means in practice. For this purpose, a number of isochors are shown in FIG. 5, i.e. lines connecting those corners of parcels that provide an equal relative fill. For the sake of clarity, FIG. 5 is shown in only two dimensions.

FIG. 5 clearly shows a disadvantage of this assessment: relatively small parcels which divide the free space into two unattractively long narrow sections are given the same score as parcels which completely fill the space in one direction.

As it is usually desirable that the free spaces remaining after the placement of a parcel in a free space have readily usable dimensions, it is better to assess these remaining free spaces. The product (C2) of the dimensions remaining after the placement of a parcel, i.e. of the remaining height, width and depth, proves to give, according to the invention, a good picture of the dimensioning of the remaining free spaces.

C2 is defined as:

$$C2:=[(Xs-Xp)/Xs]*[(Ys-Yp)/Ys]*[(Zs-Zp)/Zs]$$

C2 is again a number between 0 and 1. In this instance, however, it is the case that the smaller the numerical value of C2, the better the "fit". In the same way as for FIG. 5, FIG. 6 shows a number of lines with a constant value for C2.

Figure 6:
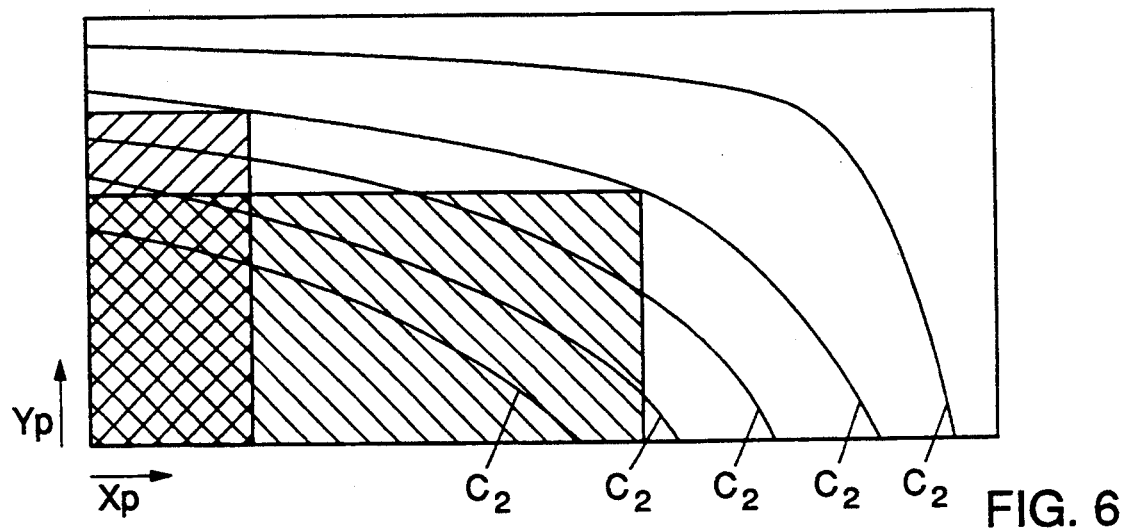
FIG. 6 shows a diagrammatic illustration of a second way of assessing the fit.

FIG. 6 clearly shows that parcels which fit reasonably in one direction, with the result that only one free space remains, are preferred to parcels which divide the space into two, with the result that C2 in principle constitutes a useful assessment criterion.

So far, however, no mention has been made of the actual load. In general, this is, for example as a consequence of gravity, asymmetric in the X, Y and Z direction. This asymmetry can also be incorporated in the assessment by emphasising the preferred orientation. This can be done with the help of the following formula:

$$C3 := [(Xs-Xp)/Xs]^k * [(Ys-Yp)/Ys]^l * [(Zs-Zp)/Zs]^m$$

Figure 7:
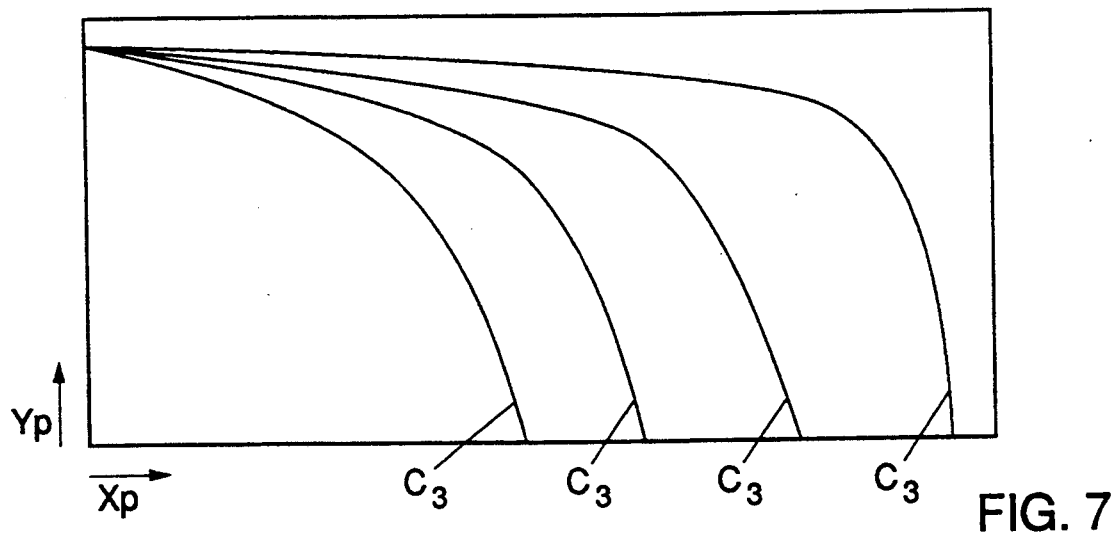
FIG. 7 shows a diagrammatic illustration of a third way of assessing the fit.

By selecting different values for the powers k, l and m, the desired asymmetry can be established. FIG. 7 shows, in the same way as FIGS. 5 and 6, the effect for different powers. The term with the highest power receives the greatest emphasis, as it will affect the score value the most. The score value C3, derived from C2, is again a number between 0 and 1, with the property that the assessment is the more favourable, the smaller the numerical value of C3.

As already explained above, the assessment of how well a parcel fits into a space only makes use of the three dimensions of the free space and the three dimensions of the parcel (length, width and height). Each parcel may, in principle, be placed in the space in six orientations.

| Orientation: | | | Rotation: |
|---|---|---|---|
| 1) Lp-Xs, | Wp-Ys, | Hp-Zs | None |
| 2) Lp-Xs, | Hp-Ys, | Wp-Zs | Around length axis |
| 3) Wp-Xs, | Lp-Ys, | Hp-Zs | Around height axis |
| 4) Wp-Xs, | Hp-Ys, | Lp-Zs | Around height and length axis |
| 5) Hp-Xs, | Wp-Ys, | Lp-Zs | Around width axis |
| 6) Hp-Xs, | Lp-Ys, | Wp-Zs | Around height and width axis |

If parcels may not be tilted, the number of orientations can be restricted to the orientations 1) and 3). In principle, however, each of the six orientations is given a score. For a number of parcels N and a number of spaces M there are then N×M×6 assessed situations.

If a parcel fits in the space, i.e. the space in all dimensions is larger than the parcel in the orientation chosen, based on the definition of C3 a "measure of fit" is determined for each dimension.

X-direction: $dX := [(Xs-Xp)/Xs]^k$

Y-direction: $dY := [(Ys-Yp)/Ys]^l$

Z-direction: $dZ := [(Zs-Zp)/Zs]^m$

The fit of a parcel in a free space can now be assessed, according to the invention, for each combination of parcel orientation and space, in five consecutive steps:

| Step: | Score: |
|---|---|
| 1: Is the parcel in this orientation too large for the space? | |
| NO ↓ | YES → >1000 |
| 2: Are all dimensions of the parcels smaller than the corresponding dimensions of the space? | |
| NO ↓ | YES → dX*dY*dZ |
| 3: Does one measurement (e.g. Zp) of the space correspond exactly to one measurement of the parcel? | |
| NO ↓ | YES → dX*dY-1 |
| 4: Do two measurments (e.g. Zp, Yp) of the space correspond to two measurements of the parcel? | |
| NO ↓ | YES → dX-2 |
| 5: The parcel fits the space exactly! | → −3 |

As dX, dY and dZ all have values between 0 and 1, the following assessments are possible:
1) Parcel does not fit         1000 < score
2) Parcel fits easily          0 < score < 1
3) One measurement fits precisely   −1 < score < 0
4) Two measurments fit precisely    −2 < score < −1
5) Parcel fits precisely       score = −3

In the case of the assessments 3, 4 and 5, as already mentioned above, an additional factor has been incorporated in the assessment, as a result of which the assessment is more favorable than in the case where the parcel fits easily in the free space. In place of the assessment 1 a fixed number FN can choosen for the score, e.g. FN=1500.

The best combination of parcel orientation and space is that with the lowest score value.

In TABLE 1, as a first example, some scores (fourth column) are given for the fit of some parcels with dimensions (Xp,Yp,Zp) (second column) in a free space with dimensions (Xs,Ys,Zs) (first column), and the step number (third column) is given of the step in which the score is established in accordance with the five consecutive steps mentioned before. The powers k, l, and m have the values k=l=m=1, and the dimensions may be thought in dm.

TABLE I

| Xs | Ys | Zs | Xp | Yp | Zp | Step No. | Score |
|---|---|---|---|---|---|---|---|
| 6 | 8 | 10 | 7 | 9 | 10 | 1 | 1500 |
| | | | 7 | 8 | 10 | 1 | 1500 |
| | | | 7 | 7 | 10 | 1 | 1500 |
| | | | 7 | 7 | 9 | 1 | 1500 |
| | | | 4 | 5 | 5 | 2 | 0.062 |
| | | | 5 | 4 | 5 | 2 | 0.042 |
| | | | 5 | 5 | 4 | 2 | 0.025 |
| | | | 6 | 4 | 5 | 3 | −0.750 |
| | | | 6 | 5 | 4 | 3 | −0.774 |
| | | | 6 | 8 | 4 | 4 | −1.6 |
| | | | 6 | 8 | 10 | 5 | −3 |

The first four parcels do not fit at all, which results in a score=1500 already in the first step; then for a fifth parcel, of which all the dimensions are smaller then the dimensions of the free space, the scores are given for three different orientations; then for a sixth parcel, of which one dimension equals one dimension of the free space, the scores are given for two different orientations; then for a seventh parcel, of which two dimensions equals two dimensions of the free space, the score is given; and finally the score is given for an eighth parcel which fits exactly in the free space. The eighth parcel has the lowest, i.e. the most favorable score (−3); then the seventh parcel (−1.6); then the sixth parcel in one of its possible orientations (−0.774), etc.

In the two-dimensional case the assessment of the fit of a parcel on a free area (i.e. a free two-dimensional space) can take place accordingly, i.e. with four consecutive steps, which result from the five consecutive steps of the three-dimensional case by leaving out one dimension. So the following assessments are possible in the two-dimensional case:

| | | |
|---|---|---|
| 1) | Parcel does not fit | $1000 < \text{score}(=FN)$ |
| 2) | Parcel fits easily | $0 < \text{score}(=dX*dY) < 1$ |
| 3) | One measurement fits precisely | $-1 < \text{score}(=dX-1) < 0$ |
| 4) | Parcel fits precisely | $\text{score} = -2$ |

As a second example in TABLE 2 some scores (fourth column) are given for the fit of some parcels with dimensions $(Xp, Yp)$ (second column) on a free area with dimensions $(Xs, Ys)$ (first column), and the step number (third column) is given of the step in which the score is established in accordance with the four consecutive steps of the two-dimensional case. The powers k and l have the values $k = l = 1$, and the dimensions may be regarded as in decimeters, for example.

TABLE 2

| Xs | Ys | Xp | Yp | Step No. | Score |
|---|---|---|---|---|---|
| 6 | 8 | 7 | 9 | 1 | 1500 |
| | | 7 | 8 | 1 | 1500 |
| | | 7 | 7 | 1 | 1500 |
| | | 4 | 5 | 2 | 0.125 |
| | | 5 | 4 | 2 | 0.083 |
| | | 6 | 4 | 3 | −0.5 |
| | | 6 | 8 | 4 | −2 |

The first three parcels do not fit at all, which results in a score = 1500 already in the first step; then for a fourth parcel, of which all the dimensions are smaller then the dimensions of the free areal the scores are given for two different orientations; then for a fifth parcel, of which one dimension equals one dimension of the free area, the score is given; and finally the score is given for a sixth parcel which fits exactly on the free area. The sixth parcel has the lowest, i.e. the most favorable score (−2); then the fifth parcel (−0.5); then the fourth parcel in one of its possible orientations (0,083), etc.

In the case of a method tested in practice, according to the invention, for loading a container, choosing $k=2$, $l=3$ and $m=1$ gave a stronger preference to the Y direction ($l=3$) and, to a lesser extent, the X direction ($k=2$). The upright positioning of parcels is thereby opposed, because $m < k, l$. The stronger preference for the Y direction (k, l) is to do with the two lateral walls of the container.

Because the term "free space" as defined above, is very general, it is also necessary to take into account, during loading, the support of a parcel. Because of gravity the choice made will always be to place the parcel in a lower corner of a free space. Other places at the bottom of a free space are in principle also possible, but they increase the calculation effort required. Depending on the support, a choice can be made from four lower corners: rear left, bottom; rear right, bottom; front left, bottom; front right, bottom.

Figure 8:
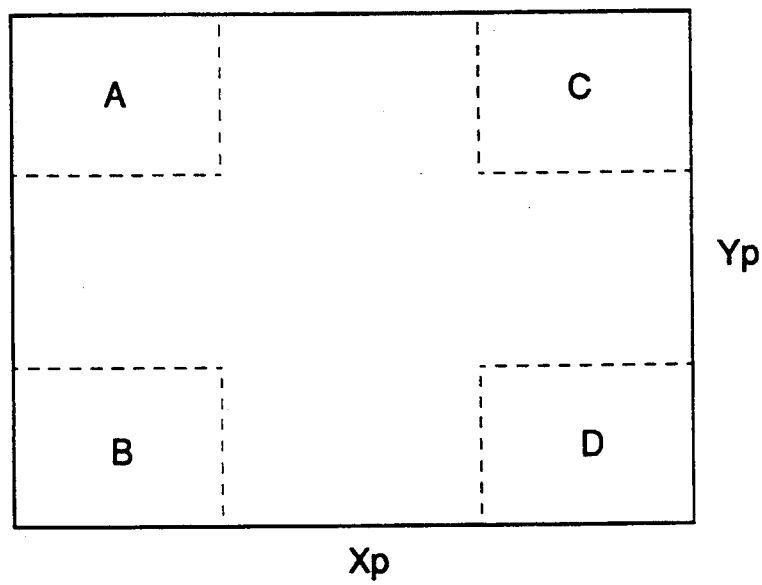
FIG. 8 shows a diagrammatic illustration of a support criterion.

By the method sketched out in FIG. 8 it is established whether there is sufficient support. Four "support rectangles" A, B, C, and D, are defined in the bottom face of a parcel 1. The size of these rectangles is defined by the parcel dimensions and the maximum permitted overhang percentage d. For a parcel not to tip over, $d < 0.5$ applies.

For a support to be acceptable, it is required that each of the four rectangular areas is supported in at least one point. The minimum support $(Xsu, Ysu)$ can be calculated as follows:

$Xsu := Xp(1 - 2*d)$ and $Ysu := Yp(1 - 2*d)$ if for example $d := 0.3$, there follows:

$Xsu = 0.4*Xp$ and $Ysu = 0.4*Yp$

If sufficient support cannot be found in any corner of the free space, the score value of that particular combination of parcel orientation and space is set at $>1000$.

Figure 9:
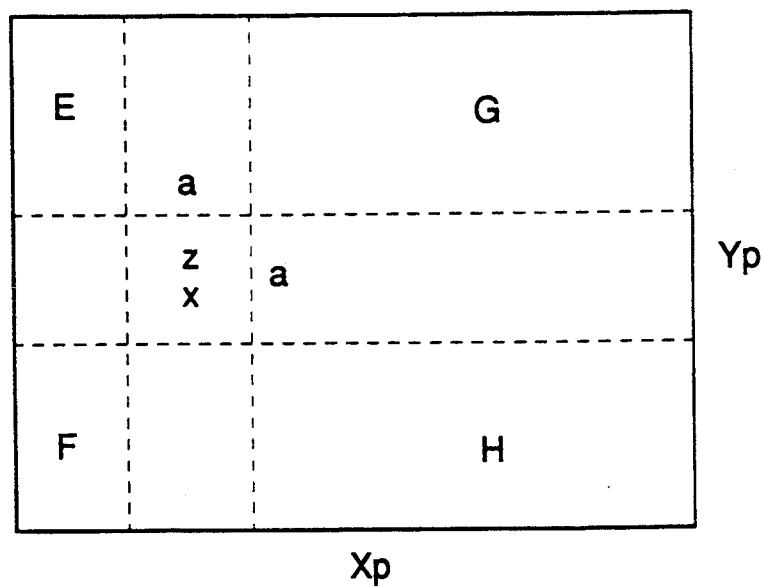
FIG. 9 shows a diagrammatic illustration of another support criterion.

To obtain effective support it is also possible, in particular in the case of parcels with a strongly asymmetrically placed center of gravity, to predetermine the center of gravity of the parcels to be placed. FIG. 9 shows by what method, based on the center of gravity, the support can be determined. For this purpose an area, for example a square with sides a, is defined around the center of gravity Z, and support rectangles E, F, G, and H are again defined adjacent to the corner points of the square. Effective support again requires in this case that each of the four rectangular areas E, F, G, and H are supported at at least one point. The square around the center of gravity Z is excluded from the support rectangles E, F, G, and H in order to prevent the parcel coming to rest, in an unstable manner, on a single parcel which is situated below the area around the center of gravity. The size of the area around the center of gravity is related to the dimensions of the parcel and can be determined experimentally.

It is to be noted that the assessment of the support produces a "true or false" result, not a score value.

Finally, in assessing the support of a parcel, the fact may also be taken into account that the parcel to be placed touches, with one or more of its lateral faces, one or more parcels already present. It will be clear that if the parcel shown in FIG. 8 comes to rest with the right-hand lateral face shown in the figure against an adjacent parcel, it is in essence sufficient if only the support rectangles A and B are each supported at one point on their bottom side.

Various options for the choice of a corner can be incorporated into the method:
1) Choice from 2 rearmost corners with a preference for left hand.
2) Random choice from 2 rearmost corners.
3) Choice from 4 corners in a particular sequence:
4) Random choice from 4 corners.

In most cases, the above choices are restricted because some corners will not give sufficient support. It goes without saying that the support plays no part in determining the most favourable placement of objects on the free part areas of a plane area.

It may also be attractive to incorporate, in the method, a preference for particular free spaces. In this way it is possible, for example, first to stack the floor densely, or the rear wall. By adjusting the score value, implicitly a greater or lesser preference may be given to particular free spaces.

Preference for lowest spaces:

| | |
|---|---|
| Maximum height (container height) | Zm |

-continued

| | |
|---|---|
| Bottom edge free space | ZBv |
| Relative height in the container | Rz = (Zm-ZBv)/Zm |
| "Weighting" parameter for the height | Pz e.g. 0 < Pz < 3 |
| Adjusted score (C3) | C3 = C3- Pz * Rz |
| Preference for rearmost spaces: | |
| Maximum depth (container depth) | Xm |
| Rear edge free space | XRv |
| Relative depth in the container | Rx = (Xm-XRv)/Xm |
| "Weighting" parameter for the depth | Px e.g. 0 < Px < 3 |
| Adjusted score (C3) | C3 = C3- Px * Rx |

The values of Px and Pz can be determined experimentally for specific applications.

In the loading method, the stability of each parcel per se may also be taken into account. A criterion for this purpose may be, for example, that the height Zp of the parcel may not be greater than a particular multiple, not necessarily an integer, of the smallest of the other two dimensions of the parcel, ie. the length Xp or the width Yp.

As an example a 3-dimensional version of the loading method combining the main steps of determining free spaces and of selecting an optimal object/free-space combination is applied in a parcel handling system, such as the system known from: S. P. Lie, "Automated parcel handling with an industrial robot", Proceedings of the Institution of Mechanical Engineers, 13-14 May 1986, Birdcage Walk, London, pp. 183-187 (copy enclosed).

The known parcel handling system comprises:

1/ a scanning device for determining the dimensions of the parcels to be packed;

2/ a mechanical buffer with separate buffer places for storing separately a certain number of scanned parcels;

3/ a robot means for picking up each single parcel from the buffer and packing it into the container;

4/ the container located in a fixed position, to be loaded by the robot;

5/ a control system for controlling the various mechanical parts of the system;

6/ processor means for running several computer programs for providing the control system with various control data for its controlling function.

In this known parcel handling system the set of computer programs running on the processor means is extended by two programs, a first one for carrying out the main step of determining free spaces and a second one for carrying out the main step of selecting an optimal object/free-space combination according to the present invention. As described above also the orientation of an object in a free-space should be taken into account for an optimal combination, but this is not made explicitly in this example for reasons of simplicity only.

In a preparing step a number of parcels to be packed is scanned one by one by the scanning device and stored separately in the mechanical parcel buffer. This may be done by hand or by using also the robot. However, since this is not relevant for the present invention, it is not further described. Then the buffered parcels are all available for the robot to load them into the container. In an initializing step of the parcel handling process the scanned data of the buffered parcels are made available for the relevant programs which run on the processor means. The first computer program determines according to the first main step free spaces in the partially loaded container each time after a parcel has been loaded into the container. With the determined free spaces as input, the second computer program selects according to the second main step an optimal combination of a free space and a buffered parcel. However since after the initializing step the container is still empty, the first free space is the empty container (which is itself to be assumed a right parallepiped) the process continues with the second main step directly. Then the robot is controlled by the control system in accordance with the selected combination in order to execute the required movements for picking up the selected parcel from the parcel buffer and for transferring it to the selected place in the container. In the mean time the first computer program determines free spaces in the partially loaded container for the new situation and the second computer program selects a next optimal buffered-parcel/free-space combination.

Figure 10:
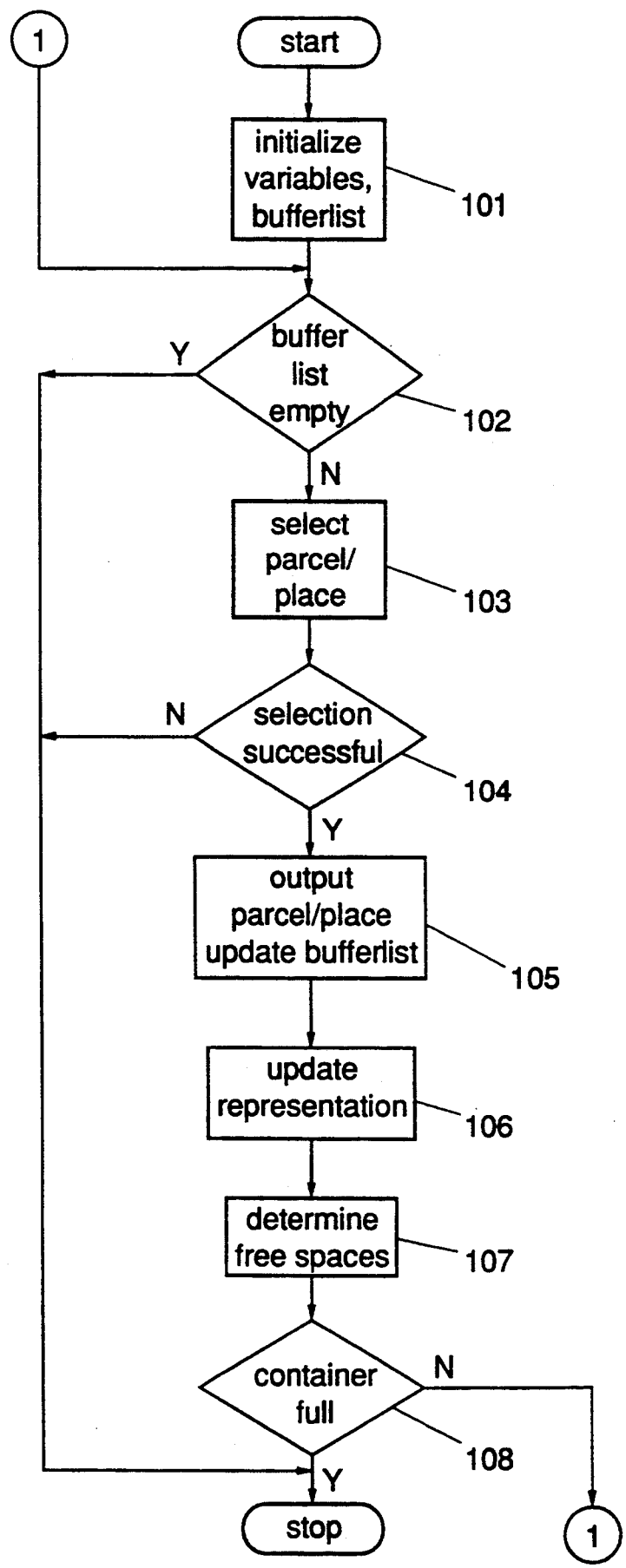
FIG. 10 shows a flowchart for a parcel loading process, in which the method according to the invention is applied.

FIG. 10 shows a flowchart which illustrates the cooperative connection of some of the computer programs mentioned above in element 6/ of the known parcel handling system, which are relevant for the present invention.

After a start the flowchart shows a box 101 INITIALIZE VARIABLES, which implies a step of initializing some program variables such as the dimensions of the container used, the minimum dimensions of a parcel, a buffer list with the dimensions and other scanned data of the parcels to be loaded present in the parcel buffer, some conditions for the loading, e.g. which side of the container is open for loading, etc. After initializing the process runs through the following cycle of steps, as indicated by the connection circles 1. In box 102 BUFFER LIST EMPTY it is checked if the buffer list is empty. If yes, the process stops. If the buffer list is not empty the second main step of selecting an optimal buffered-parcel/free-space combination is carried out, as indicated by box 103 SELECT PARCEL/PLACE. Then it is checked if the selecting is successful as indicated by box 104 SELECTION SUCCESSFUL. If not, which can be the case, e.g. if none of the parcels in the buffer fits in any one of the determined free spaces for any one of the possible orientations, then the process stops. If yes, then the selected combination is presented to the control system for placing the selected parcel from the parcel buffer into the container on the selected free space; and the data of the selected parcel is cancelled from the buffer list and the data of a possible newly buffered parcel is entered in the buffer list. This is indicated by box 105 OUTPUT PARCEL/PLACE; UPDATE BUFFER LIST. Then the matrix of the matrix representation is adjusted to the new situation in the container as indicated by box 106 UPDATE REPRESENTATION. Then the first main step of determining all free spaces in the container in this new situation is carried out, as indicated by box 107 DETERMINE FREE SPACES. If at least one free space is found the process repeats the steps from box 102 via the connection circles 1. If the container is full then the process stops.

I claim:

1. A method for optimally placing rectangular objects on an area having dimensions X and Y and already partially covered with at least one rectangular object, comprising the steps of:

depicting said area in the form of a two-dimensional matrix (x, y) having x rows and y columns, each element of the matrix representing a rectangle on the area and it being established for each element whether the corresponding rectangle in the area is free or occupied;

assigning to the respective elements of the matrix a first logic value (A) in the first mentioned case and a second logic value (B) in the case mentioned second, there being a free subarea on the area if a first equation group (I) is satisfied, which states $(x_l, y_l) = B$ and $(x_{l-1}, y_l) = A$ and $(x_l, y_{l-1}) = A$ and $(x_{l+1}, Y_l) = A$ $(x_l, y_{l+1}) = A$ for the corresponding element in the matrix;

carrying out a matrix reduction after determining the elements $x_l$, $y_l$ which satisfy (I), by always reducing by one the number of rows or the number of columns in the matrix in a predetermined sequence in consecutive steps until a (1, 1) matrix is left, the possible free subareas always being determined after a reduction step with the aid of (I); the number of rows being reduced by determining a second equation group (II) which states for each element $(x_l, y_l)$ of each row, whether $(x_l, y_l) = B$ and $(x_{l+1}, y_l) = B$, in which case the element $(x_l, y_l)' := B$ in the reduced matrix $(x,y)'$ and if said equation group (II) is not satisfied, the element $(x_l, y_l)' := A$; the number of columns being reduced by determining, for each element $(x, y)$ of each column, whether a third equation group (III) is satisfied which states $(x_l, y_l) = B$ and $(x_l, y_{l+1}) = B$, in which case the element $(x_l, y_l)' := B$ in the reduced matrix $(x,y)'$, and if said third equation group (III) is not satisfied, the element $(x_l, y_l)' := A$; the dimensions of the free subareas determined using said first equation group (I) being determined by updating a dimension table both for the rows and for the columns of the matrix, and by adjusting the dimension table for the rows or for the columns in a corresponding step during the matrix reduction, locating free subareas by matrix reduction to a null matrix in each dimension, and placing objects fitting into said free subareas.

2. A method for optimally placing objects in the shape of a rectangular parallelepiped in a space partially filled with objects in said form, comprising the steps of:

measuring the dimensions of the rectangle sides (Xp, Yp and Zp) of a plurality of said objects;

depicting a space essentially having the form of a right parallelepiped and having dimensions X, Y and Z in the form of three-dimensional matrix (x,y,z) having x rows, y columns and z layers, each element of the matrix representing a right parallelepiped in the space and establishing for each element whether the corresponding right parallelepiped in the space is free or occupied, assigning the corresponding element of the associated matrix a first logic value (A) in the first mentioned case and a second logic value (B) in the case mentioned second, there being a free subspace in the space if a first equation group (I) is satisfied which states $(x_l,y_l,z_l) = B$ and $(x_{l-1},y_l,z_l) = A$ and $(x_l,y_{l-1},z_1) = A$ and $(x_{l+1},y_l,z_l) = A$ and $(x_l,y_{l+1},z_l) = A$ and $(x_l,y_l,z_{l-1}) = A$ and $(x_l,y_l,z_{l+1}) = A$ for the corresponding element in the matrix;

carrying out a matrix reduction after determining the elements $(x_l,y_l,z_l)$ which satisfy said first equation group (I), by reducing by one the number of rows or the number of columns or the number of layers of the matrix in a predetermined sequence in consecutive steps until a (1,1,1) matrix or a null matrix is left, the possible free subspaces, if any, always being determined after a reduction step with the aid of said first equation group (I); the number of rows being reduced by determining, for each element $(x_l,y_l,z_l)$ of the matrix, whether a second equation group (II) is satisfied which states $(x_l,y_l,z_l) = B$ and $(x_{l+1},y_l,z_l) = B$, in which case the element $(x_l,y_l,z_l)' := B$ in the reduced matrix $(x, y, z)'$, and if said second equation group (II) is not satisfied, the element $(x_l, y_l, z_l)' = A$; the number of columns being reduced by determining whether a third equation group (III) is satisfied which states $(x_l, y_l, z_l) = B$ and $(x_l, y_{l+1}, z_l) = B$, in which case the element $(x_l, y_l, z_l)' := B$ in the reduced matrix $(x, y, z)'$, and if said third equation group (III) is not satisfied, then the element $(x_l, y_l, z_l)' = A$; the number of layers being reduced by determining whether a fourth equation group (IV) is satisfied which states $(x_l, y_l, z_l) = B$ and $(x_l, y_l, z_{l+1}) = B$, in which case the element $(x_l, y_l, z_l)': = B$ in the reduced matrix $(x, y, z)'$, and if said fourth equation group (IV) is not satisfied, then the element $(x_l, y_l, z_l)' = A$;

finding the dimensions of the free subspaces determined using said first equation group (I) by updating a dimension table for the rows and for the columns and for the layers of the matrix, and by adjusting the dimension table for the rows or the columns or the layers in a corresponding step during the matrix reduction, and placing in said free subspaces said objects fitting into said free subspaces.

3. A method for optimally placing rectangular objects on an area being possibly, but not necessarily, already partially covered with rectangular objects, comprising the steps of:

measuring the dimensions of the rectangle sides (Xp and Yp) of a plurality of said objects;

locating on said area a plurality of free rectangular portions of said area having rectangle sides (Xs and Ys);

establishing a score for each one of said free rectangular portions of said area, for each of said objects, and for each of two possible orientations in which rectangle sides of said objects are parallel to or aligned with rectangle sides of said rectangular portion of said area, by assigning score values, in respective substeps, corresponding to the following determinations:

(1) whether said object in a said orientation is too large for fitting in said portion of said area;

(2) whether all dimensions of said object (Xp, Yp) are smaller than the corresponding dimensions of said portion (Xs, Ys) of said area;

(3) whether one dimension of said portion (Xs, or Ys) of said area corresponds to one dimension of said object (Xp or Yp), and (4) whether two dimensions of said portion (Xs, and Ys) of said area correspond to two dimensions of the object (Xp and Yp), said score being the more favorable as the score value is assigned corresponding to a determination in a substep with a higher number of the above-designated numbers (1,2,3 or 4) of said substeps which produces an affirmative answer, and thereafter selecting and placing an object in a free area portion and in an orientation for which a most favorable score was established among respective scores for said plurality of portions and said plurality of objects and said orientations.

4. The method of claim 3, wherein the most favorable score corresponds with the lowest score value among the respective assigned score values as scores for said plurality of portions, said plurality of objects and said possible orientations, and in substep (2) corresponding to the determination whether all dimensions of said object (Xp, Yp) are smaller than the corresponding dimensions of said portion (Xs, Ys) of said area the assigned score value is:

score value = $[(Xs-Xp)/Xs]^{k*}$ $[(Ys-Yp)/Ys]^{l}$
wherein k and $l \geqq 1$.

5. The method of claim 3, wherein the step of locating on said area a plurality of free rectangular portions of said area having rectangle side (Xs and Ys) comprising the following substeps of:

depicting said area in the form of a two-dimensional matrix (x, y) having x rows and y columns, each element of the matrix representing a rectangle on the area and it being established for each element whether the corresponding rectangle in the area is free or occupied;

assigning to the respective elements of the matrix a first logic value (A) in the first mentioned case and a second logic value (B) in the case mentioned second, there being a free subarea on the area if a first equation group (I) is satisfied, which states ($x_l$, $y_l$)=B and ($x_{l-1}$, $y_l$)=A and ($x_l$, $y_{l-1}$)=A and ($x_{l+1}$, $y_l$)=A ($x_l$, $y_{l+1}$)=A for the corresponding element in the matrix;

carrying out a matrix reduction after determining the elements $x_l$, $y_1$ which satisfy (I), by always reducing by one the number of rows or the number of columns in the matrix in a predetermined sequence in consecutive steps until a (1, 1) matrix is left, the possible free subareas always being determined after a reduction step with the aid of (I); the number of rows being reduced by determining a second equation group (II) which states for each element ($x_l$, $y_l$) of each row, whether ($x_l$,$y_l$)=B and ($x_{l+1}$, $y_l$)=B, in which case the element ($x_l$,$y_l$)':=B in the reduced matrix (x y)', and if said equation group (II) is not satisfied, the element ($x_l$,$y_l$)':=A; the number of columns being reduced by determining, for each element (x,y) of each column, whether a third equation group (III) is satisfied which states ($x_l$,$y_l$)=B and ($x_l$,$y_{l+1}$)=B, in which case the element ($x_l$,$y_l$)':=B in the reduced matrix (x,y)', and if said third equation group (III) is not satisfied, the element ($x_l$,$y_l$)':=A; the dimensions of the free subareas determined using said first equation group (I) being determined by updating a dimension table both for the rows and for the columns of the matrix, and by adjusting the dimension table for the rows or for the columns in a corresponding step during the matrix reduction, each determined free subarea defining a free rectangular portion of said plurality of portions of said area.

6. A method for optimally placing objects in the shape of a rectangular parallelepiped in a space being possibly, but not necessarily, already partially filled with objects in said form, comprising the steps of:

measuring the dimensions of the rectangle sides (Xp, Yp and Zp) of a plurality of said objects;

locating in said space a plurality of portions of free space in the shape of a rectangular parallelepiped having rectangle sides (Xs, Ys and Zs); and establishing a score for each of said portions of free space, for each of said objects, for each of six possible orientations in which rectangle sides of said objects are parallel to or aligned with rectangle sides of said rectangular portion of said free space, by assigning score values, in respective substeps, corresponding to the following determinations:

(1) whether an object (Xp, Yp, Zp) in a said orientation is too large for fitting in said portion (Xs, Ys, Zs) of said space;

(2) whether all dimensions of said object (Xp, Yp, Zp) are smaller than the corresponding dimensions of said portion (Xs, Ys, Zs) of said free space;

(3) whether one dimension of said portion (Xs, Ys or Zs) of said free space corresponds to one dimension of said object (Xp, Yp or Zp);

(4) whether two dimensions of said portion (Xs, Ys, Zs) of said free space correspond to two dimensions of said object, and (5) whether three dimensions of said portion (Xs, Ys, Zs) of said free space correspond to three dimensions of said object, said score being the more favorable as the score value is assigned corresponding to a determination in a substep with a higher number of the above-designated numbers (1,2,3,4 or 5) of said substeps which produces an affirmative answer, and thereafter selecting and placing an object in a portion of free space and in an orientation for which a most favorable score was established among respective scores for said plurality of portions and said plurality of objects and said orientations.

7. The method of claim 6, wherein the most favorable score corresponds with the lowest score value among the respective assigned score values as scores for said plurality of portions, said plurality of objects and said possible orientations, and in the event of an affimative determination in substep (2) signifying that all dimensions of said object (Xp, Yp, Zp) are smaller than the corresponding dimensions of said portion (Xs, Ys, Ys) of said area, the assigned score value is:

score value = $[(Xs-Xp)/Xs]^{k*}$ $[(Ys-Yp)/Ys]^{l*}$ $[(Zs-Zp)/Zs]^{m}$
wherein k, l and m > 1.

8. The method according to claim 7, wherein, prior to or concurrently with the step of establishing a score, a determination is made whether said object would be sufficiently supported in said portion (Xs, Ys, Zs) of said free space, and wherein in the event said support determination is answered in the negative, said object thereby found insufficiently supported is rejected for placement.

9. The method according to claim 8, wherein four areas are defined for said object on its bottom face, which areas do not overlap each other and each of which comprise a corner point of said object, and wherein if each of said areas upon placement is supported at at least one point, said object is found sufficiently supported and said support determination is answered in the affirmative.

10. The method according to claim 9, wherein prior to the method step of defining said four areas on the bottom face of said object, there are performed a method step of locating a center of gravity on the bottom face of said object and thereafter a method step of defining an area around the located center of gravity, which defined area is to be barred from inclusion in said four areas when they are defined.

11. The method according to claim 10, wherein prior to the method step of determining whether a said object would be sufficiently supported, a method step is performed of determining whether in placing said object in said free space said object would come to rest with a lateral face against an adjacent object, and in the event of an affirmative dtermination in the method step just mentioned, the subsequent step of determining sufficient support is carried out on the basis that any of said four areas which is adjacent to said lateral face adjacent to another object does not need to be supported for an affirmation of sufficient support.

12. The method according to claim 8, wherein, prior to or concurrently with the step of establishing a score, a determination is made whether said object would be sufficiently supported in said portion (Xs, Ys, Zs) of said free space, and wherein in the event said support determination is answered in the negative, said object thereby found insufficiently supported is rejected for placement.

13. The method according to claim 12, wherein four areas are defined for said object on its bottom face, which areas do not overlap each other and each of which comprise a corner point of said object, and wherein if each of said areas upon placement is supported at at least one point, said object is found sufficiently supported and said support determination is answered in the affirmative.

14. The method according to claim 13, wherein prior to the method step of defining said four areas on the bottom face of said object, there are performed a method step of locating a center of gravity on the bottom face of said object and thereafter a method step of defining an area around the located center of gravity, which defined area is to be barred from inclusion in said four areas when they are defined.

15. The method according to claim 14, wherein prior to the method step of determining whether a said object would be sufficiently supported, a method step is performed of determining whether in placing said object in said free space said object would come to rest with a lateral face against an adjacent object, and in the event of an affirmative dtermination in the method step just mentioned, the subsequent step of determining sufficient support is carried out on the basis that any of said four areas which is adjacent to said lateral face adjacent to another object does not need to be supported for an affirmation of sufficient support.

16. The method of claim 6, wherein the step of locating in said space a plurality of free portions of free space in the shape of a rectangular parallelepiped having rectangle sides (Xs, Ys and Zs) comprises the following substeps of:

depicting a space essentially having the form of a right parallelepiped and having dimensions X, Y and Z in the form of three-dimensional matrix (x,y,z) having x rows, y columns and z layers, each element of the matrix representing a right parallelepiped in the space and establishing for each element whether the corresponding right parallelepiped in the space is free or occupied, assigning the corresponding element of the associated matrix a first logic value (A) in the first mentioned case and a second logic value (B) in the case mentioned second, there being a free subspace in the space if a first equation group (I) is satisfied which states $(x_l,y_l,z_l)=B$ and $(x_{l-1},y_l,z_l)=A$ and $(x_l,y_{l-1},z_l)=A$ and $(x_{l+1},y_l,z_l)=A$ and $(x_l,y_{l+1},z_l)=A$ and $(x_l,y_l,z_{l-1})=A$ and $(x_l,y_l,z_{l+1})=A$ for the corresponding element in the matrix;

carrying out a matrix reduction after determining the elements $(x_l,y_l,z_l)$ which satisfy said first equation group (I), by reducing by one the number of rows or the number of columns or the number of layers of the matrix in a predetermined sequence in consecutive steps until a (1,1,1) matrix or a null matrix is left, the possible free subspaces, if any, always being determined after a reduction step with the aid of said first equation group (I); the number of rows being reduced by determining, for each element $(x_l,y_l,z_l)$ of the matrix, whether a second equation group (II) is satisfied which states $(x_l,y_l,z_l)=B$ and $(x_{l+1},y_l,z_l)=B$, in which case the element $(x_l,y_l,z_l)':=B$ in the reduced matrix (x, y, z)', and if said second equation group (II) is not satisfied, the element $(x_l, y_l, z_l)'=A$; the number of columns being reduced by determining whether a third equation group (III) is satisfied which states $(x_l, y_l, z_l)=B$ and $(x_l, y_{l+1}, z_l)=B$, in which case the element $(x_l, y_l, z_l)':=B$ in the reduced matrix (x, y, z)', and if said third equation group (III) is not satisfied, then the element $(x_l, y_l, z_l)'=A$; the number of layers being reduced by determining whether a fourth equation group (IV) is satisfied which states $(x_l, y_l, z_l)=B$ and $(x_l, y_l, z_{l+1})=B$, in which case the element $(x_l, y_l, z_l)':=B$ in the reduced matrix (x, y, z)', and if said fourth equation group (IV) is not satisfied, then the element $(x_l, y_l, z_l)'=A$;

finding the dimensions of the free subspaces determined using said first equation group (I) by updating a dimension table for the rows and for the columns and for the layers of the matrix, and by adjusting the dimension table for the rows or the columns or the layers in a corresponding step during the matrix reduction, each determined free subspace defining a free rectangular parallelepiped portion of said plurality of portions of free space in said space.

17. A method for optimally placing objects in the shape of a rectangular parallelepiped in a space available for storage or transportation of said objects and being possibly, but not necessarily, already partially occupied with objects of said shape, comprising the steps of:

(a) measuring the dimensions of the rectangle sides (Xp, Yp and Zp) of a plurality of said objects;

(b) locating in said space a plurality of portions of free space in the shape of a rectangular parallelepiped having rectangle sides (Xs, Ys and Zs);

(c) establishing a score for each of said portions, for each of said objects, for each of six possible orientations in which rectangle sides of said objects are parallel to or aligned with rectangle sides of said rectangular portion of said space, by assigning score values, in respective substeps, corresponding to the following determinations:

(1) whether an object (Xp, Yp, Zp) in a said orientation is too large for fitting in said portion (Xs, Ys, Zs) of said space;

(2) whether all dimensions of said object (Xp, Yp, Zp) are smaller than the corresponding dimensions of said portion (Xs, Ys, Zs) of said free space;

(3) whether one dimension of said portion (Xs, Ys or Zs) of said free space corresponds to one dimension of said object (Xp, Yp or Zp);

(4) whether two dimensions of said portion (Xs, Ys, Zs) of said free space correspond to two dimensions of said object, and (5) whether three dimensions of said portion (Xs, Ys, Zs) of said free space correspond to three dimensions of said object, said score being the more favorable as the score value is assigned corresponding to a determination in a substep with a higher number of the above-designated numbers (1,2,3,4 or 5) of said substeps which produces an affirmative answer;

(d) selecting and placing an object in a free portion of free space and in an orientation for which a most favorable score was established among respective scores for said plurality of said portions and said plurality of objects and said possible orientations, thereby leaving unoccupied a free space portion of the originally available space;

(e) adding to said plurality of said objects a next object, if any, and measuring the dimensions of the rectangle sides (Xp, Yp and Zp) of said next object;

(f) repeating method steps (b) through (e) with the plurality of space portions defined in step (b) henceforth being a plurality of portions of free space remaining after an immediately previous performance of method steps (b) through (e), until either all objects of said plurality are placed in previously free space or else no more objects of said plurality can fit in space left free by the most recent performance of method steps (b) through (e).

18. The method of claim 17, wherein the step (b) of locating in said space a plurality of free portions of free space in the shape of a rectangular parallelepiped having rectangle sides (Xs, Ys and Zs) comprises the following substeps of:

depicting a space essentially having the form of a right parallelepiped and having dimensions X, Y and Z in the form of three-dimensional matrix (x,y,z) having x rows, y columns and z layers, each element of the matrix representing a right parallelepiped in the space and establishing for each element whether the corresponding right parallelepiped in the space is free or occupied, assigning the corresponding element of the associated matrix a first logic value (A) in the first mentioned case and a second logic value (B) in the case mentioned second, there being a free subspace in the space if a first equation group (I) is satisfied which states $(x_l, y_l, z_l) = B$ and $(x_{l-1}, y_l, z_l) = A$ and $(x_l, y_{l-1}, z_l) = A$ and $(x_{l+1}, y_l, z_l) = A$ and $(x_l, y_{l+1}, z_l) = A$ and $(x_l, y_l, z_{l-1}) = A$ and $(x_l, y_l, z_{l+1}) = A$ for the corresponding element in the matrix;

carrying out a matrix reduction after determining the elements $(x_l, y_l, z_l)$ which satisfy said first equation group (I), by reducing by one the number of rows or the number of columns or the number of layers of the matrix in a predetermined sequence in consecutive steps until a (1,1,1) matrix or a null matrix is left, the possible free subspaces, if any, always being determined after a reduction step with the aid of said first equation group (I); the number of rows being reduced by determining, for each element $(x_l, y_l, z_l)$ of the matrix, whether a second equation group (II) is satisfied which states $(x_l, y_l, z_l) = B$ and $(x_{l+1}, y_l, z_l) = B$, in which case the element $(x_l, y_l, z_l)' := B$ in the reduced matrix (x, y, z)', and if said second equation group (II) is not satisfied, the element $(x_l, y_l, z_l)' = A$; the number of columns being reduced by determining whether a third equation group (III) is satisfied which states $(x_l, y_l, z_l) = B$ and $(x_l, y_{l+1}, z_l) = B$, in which case the element $(x_l, y_l, z_l)' := B$ in the reduced matrix (x, y, z)', and if said third equation group (III) is not satisfied, then the element $(x_l, y_l, z_l)' = A$; the number of layers being reduced by determining whether a fourth equation group (IV) is satisfied which states $(x_l, y_l, z_l) = B$ and $(x_l, y_l, z_{l+1}) = B$, in which case the element $(x_l, y_l, z_l)' := B$ in the reduced matrix (x, y, z)', and if said fourth equation group (IV) is not satisfied, then the element $(x_l, y_l, z_l)' = A$;

finding the dimensions of the free subspaces determined using said first equation group (I) by updating a dimension table for the rows and for the columns and for the layers of the matrix, and by adjusting the dimension table for the rows or the columns or the layers in a corresponding step during the matrix reduction, each determined free subspace defining a free rectangular parallelepiped portion of said plurality of portions of free space in said space.

* * * * *

UNITED STATES PATENT AND TRADEMARK OFFICE
CERTIFICATE OF CORRECTION

PATENT NO. : 5,430,831

DATED : July 4, 1995

INVENTOR(S) : SNELLEN

Page 1 of 3

It is certified that error appears in the above-indentified patent and that said Letters Patent is hereby corrected as shown below:

Title page, Item [56] "References Cited"

under heading "OTHER PUBLICATIONS", line 2, change
        "H. Gehrin et al." to --H. Gehring et al.--;
        (Col. 2) line 2, change "Dr." to --Dr--.

Column 1, line 38 change "zpplies" to --applies--;
        line 44, delete "an";
        line 54, change "int he" to --in the--;
        line 55, change "ot" to --not--.

Column 2, line 1, change "apare" to --spare--;
        line 9, change "is" to --it--;
        line 23, change "ecessary" to --necessary--;
        line 30, change "three-eimensional" to
            --three-dimensional--;
        line 34, change "whethe rthe" to --whether the--;
        line 40, change "int he" to --in the--; same line,
           change "apredetrmined" to --a predetermined--;
        line 62, delete "or" (second occurrence)

UNITED STATES PATENT AND TRADEMARK OFFICE
CERTIFICATE OF CORRECTION

PATENT NO. : 5,430,831
DATED : July 4, 1995
INVENTOR(S) : SNELLEN

Page 2 of 3

It is certified that error appears in the above-indentified patent and that said Letters Patent is hereby corrected as shown below:

Column 3, line 4, change "establihsed" to --established--;
         line 15, after "this" insert --third--;
         line 19, "[Xs-XP)/Xs]$^{k^*}$" to --[(Xs - Xp)/Xs]$^{k^*}$--;
         line 21, change "two-eimensinal" to
            --two-dimensional--.
         line 40, before "The" insert --Remark:--;
         line 45, change "Mathematicl" to --Mathematical--.

Column 4, line 14, after "invention" change "." to --;--;
         line 20, change "mehtod" to --method--;
         line 48, change "1|000011110" to
            --1|000011100--.

Column 18, line 29, change "case" to --place--.

Column 19, line 39, change "areal" to --area--.

UNITED STATES PATENT AND TRADEMARK OFFICE
CERTIFICATE OF CORRECTION

PATENT NO. : 5,430,831
DATED : July 4, 1995
INVENTOR(S) : SNELLEN

It is certified that error appears in the above-indentified patent and that said Letters Patent is hereby corrected as shown below:

Column 21, line 10, change "...Px e.g. 0 < Px <3" to
--Px e.g.: 0 < Px < 3--;
line 37, delete "means".

Column 27, line 7, (claim 11), change "dtermination" to
--determination--.
line 13, (claim 12), change "claim 8" to
--claim 6--.

Signed and Sealed this

Eleventh Day of November, 1997

Attest:

BRUCE LEHMAN

Attesting Officer  Commissioner of Patents and Trademarks